US006914784B1

(12) United States Patent
Chilton et al.

(10) Patent No.: US 6,914,784 B1
(45) Date of Patent: Jul. 5, 2005

(54) DATA STORAGE SYSTEM CABINET

(75) Inventors: Kendell A. Chilton, Southborough, MA (US); Natan Vishlitzky, Brookline, MA (US); Joseph Gerard Mettee, Jr., Chelmsford, MA (US); Ralph L. Specht, Jr., Westborough, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 10/180,749

(22) Filed: Jun. 26, 2002

(51) Int. Cl.$^7$ ................................................ H05K 5/00
(52) U.S. Cl. ...................... 361/724; 361/679; 361/686; 361/728; 361/760; 710/20; 710/29; 710/100
(58) Field of Search .................... 361/679, 683–686, 361/724–728, 736, 748, 760; 710/20, 29, 100, 104, 305

(56) References Cited

U.S. PATENT DOCUMENTS

| | | | |
|---|---|---|---|
| 4,476,526 A | 10/1984 | Dodd | |
| 5,206,939 A | 4/1993 | Yanai et al. | |
| 5,361,249 A | 11/1994 | Monastra et al. | |
| 5,396,596 A | 3/1995 | Hashemi et al. | |
| 5,426,761 A | 6/1995 | Cord et al. | |
| 6,230,217 B1 | 5/2001 | Tuccio et al. | |
| 6,389,494 B1 | 5/2002 | Walton et al. | |
| 6,452,809 B1 * | 9/2002 | Jackson et al. | 361/796 |
| 6,510,050 B1 | 1/2003 | Lee et al. | 361/685 |
| 6,516,390 B1 | 2/2003 | Chilton et al. | |
| 6,529,521 B1 | 3/2003 | MacArthur | |
| 6,567,272 B1 * | 5/2003 | Merkin | 361/724 |
| 6,684,268 B1 | 1/2004 | Paluzzi | |
| 6,708,252 B2 | 3/2004 | Yamamoto | |
| 6,745,347 B1 | 6/2004 | Beardsley et al. | |
| 6,751,703 B2 | 6/2004 | Chilton | |
| 2003/0033463 A1 * | 2/2003 | Garnett et al. | |
| 2003/0097487 A1 * | 11/2003 | Rietze et al. | |

FOREIGN PATENT DOCUMENTS

| | | |
|---|---|---|
| EP | 0 108 651 A2 | 6/1984 |
| GB | 2146812 A | 4/1985 |
| WO | WO 94/19743 | 9/1994 |

OTHER PUBLICATIONS

U.S. Appl. No. 10/180,704, filed Jun. 26, 2002.
U.S. Appl. No. 10/180,750, filed Jun. 26, 2002.
CLARiiON®Disk–Array Processor Enclosure (DPE) Installation and Service for 44XX/45XX Rackmount Models, Copyright 1999, pp. 1–1–1–7 and 2–12.

* cited by examiner

*Primary Examiner*—Yean-Hsi Chang

(57) ABSTRACT

A cabinet having a plurality of rack mountable chassis. One portion of such chassis has directors and electrically interconnected memory and another portion of such chassis has a plurality of disk drives. The plurality of chassis are electrically interconnected to provide a data storage system interface. A first one of such chassis includes a memory and a plurality of directors. A first plurality of the directors is adapted for coupling to a host computer/server. A second one of such chassis has a plurality of disk drives. Also includes are first electrical conductors for connecting the disk drives in the second chassis to a second plurality of directors in the first one of the chassis. A third one of such chassis includes a memory and a plurality of directors. The first plurality of the directors in the third one of the chassis are adapted for coupling to the host computer/server. A fourth one of such chassis has a plurality of disk drives. Second electrical conductors are provided for connecting the disk drives in the fourth of the chassis to a second plurality of directors in the third one of the chassis. Third electrical connectors are provided for electrically the memories in the first one of the chassis and the third one of such chassis to enable the first plurality of directors and the second plurality of directors in the first and third ones of the chassis to control data transfer between a host computer/server and a bank of disk drives as such data passes through the memories the first one of the chassis and in the third one of the chassis.

10 Claims, 18 Drawing Sheets

DATA STORAGE SYSTEM CABINET

TECHNICAL FIELD

This invention relates generally to data storage systems, and more particularly to data storage systems having redundancy arrangements to protect against total system failure in the event of a failure in a component or subassembly of the storage system.

BACKGROUND

As is known in the art, large host computers and servers (collectively referred to herein as "host computer/servers") require large capacity data storage systems. These large computer/servers generally includes data processors, which perform many operations on data introduced to the host computer/server through peripherals including the data storage system. The results of these operations are output to peripherals, including the storage system.

One type of data storage system is a magnetic disk storage system. Here a bank of disk drives and the host computer/server are coupled together through an interface. The interface includes "front end" or host computer/server controllers (or directors) and "back-end" or disk controllers (or directors). The interface operates the controllers (or directors) in such a way that they are transparent to the host computer/server. That is, data is stored in, and retrieved from, the bank of disk drives in such a way that the host computer/server merely thinks it is operating with its own local disk drive. One such system is described in U.S. Pat. No. 5,206,939, entitled "System and Method for Disk Mapping and Data Retrieval", inventors Moshe Yanai, Natan Vishlitzky, Bruno Alterescu and Daniel Castel, issued Apr. 27, 1993, and assigned to the same assignee as the present invention.

As described in such U.S. Patent, the interface may also include, in addition to the host computer/server controllers (or directors) and disk controllers (or directors), addressable cache memories. The cache memory is a semiconductor memory and is provided to rapidly store data from the host computer/server before storage in the disk drives, and, on the other hand, store data from the disk drives prior to being sent to the host computer/server. The cache memory being a semiconductor memory, as distinguished from a magnetic memory as in the case of the disk drives, is much faster than the disk drives in reading and writing data.

The host computer/server controllers, disk controllers and cache memory are interconnected through a backplane printed circuit board. More particularly, disk controllers are mounted on disk controller printed circuit boards. The host computer/server controllers are mounted on host computer/server controller printed circuit boards. And, cache memories are mounted on cache memory printed circuit boards. The disk directors, host computer/server directors, and cache memory printed circuit boards plug into the backplane printed circuit board. In order to provide data integrity in case of a failure in a director, the backplane printed circuit board has a pair of buses. One set the disk directors is connected to one bus and another set of the disk directors is connected to the other bus. Likewise, one set the host computer/server directors is connected to one bus and another set of the host computer/server directors is directors connected to the other bus. The cache memories are connected to both buses. Each one of the buses provides data, address and control information.

The arrangement is shown schematically in FIG. 1. Thus, the use of two buses B1, B2 provides a degree of redundancy to protect against a total system failure in the event that the controllers or disk drives connected to one bus, fail. Further, the use of two buses increases the data transfer bandwidth of the system compared to a system having a single bus. Thus, in operation, when the host computer/server 12 wishes to store data, the host computer 12 issues a write request to one of the front-end directors 14 (i.e., host computer/server directors) to perform a write command. One of the front-end directors 14 replies to the request and asks the host computer 12 for the data. After the request has passed to the requesting one of the front-end directors 14, the director 14 determines the size of the data and reserves space in the cache memory 18 to store the request. The front-end director 14 then produces control signals on one of the address memory busses B1, B2 connected to such front-end director 14 to enable the transfer to the cache memory 18. The host computer/server 12 then transfers the data to the front-end director 14. The front-end director 14 then advises the host computer/server 12 that the transfer is complete. The front-end director 14 looks up in a Table, not shown, stored in the cache memory 18 to determine which one of the back-end directors 20 (i.e., disk directors) is to handle this request. The Table maps the host computer/server 12 addresses into an address in the bank 14 of disk drives. The front-end director 14 then puts a notification in a "mail box" (not shown and stored in the cache memory 18) for the back-end director 20, which is to handle the request, the amount of the data and the disk address for the data. Other back-end directors 20 poll the cache memory 18 when they are idle to check their "mail boxes". If the polled "mail box" indicates a transfer is to be made, the back-end director 20 processes the request, addresses the disk drive in the bank 22, reads the data from the cache memory 18 and writes it into the addresses of a disk drive in the bank 22.

When data is to be read from a disk drive in bank 22 to the host computer/server 12 the system operates in a reciprocal manner. More particularly, during a read operation, a read request is instituted by the host computer/server 12 for data at specified memory locations (i.e., a requested data block). One of the front-end directors 14 receives the read request and examines the cache memory 18 to determine whether the requested data block is stored in the cache memory 18. If the requested data block is in the cache memory 18, the requested data block is read from the cache memory 18 and is sent to the host computer/server 12. If the front-end director 14 determines that the requested data block is not in the cache memory 18 (i.e., a so-called "cache miss") and the director 14 writes a note in the cache memory 18 (i.e., the "mail box") that it needs to receive the requested data block. The back-end directors 20 poll the cache memory 18 to determine whether there is an action to be taken (i.e., a read operation of the requested block of data). The one of the back-end directors 20 which poll the cache memory 18 mail box and detects a read operation reads the requested data block and initiates storage of such requested data block stored in the cache memory 18. When the storage is completely written into the cache memory 18, a read complete indication is placed in the "mail box" in the cache memory 18. It is to be noted that the front-end directors 14 are polling the cache memory 18 for read complete indications. When one of the polling front-end directors 14 detects a read complete indication, such front-end director 14 completes the transfer of the requested data which is now stored in the cache memory 18 to the host computer/server 12.

The use of mailboxes and polling requires time to transfer data between the host computer/server 12 and the bank 22 of disk drives thus reducing the operating bandwidth of the interface.

As is also known in the art, it is desirable to reduce the cost of data storage systems.

SUMMARY

In accordance with the present invention, a cabinet is provided having a plurality of rack mountable chassis. One portion of such chassis has directors and electrically interconnected memory and another portion of such chassis has a plurality of disk drives. The plurality of chassis are electrically interconnected to provide a data storage system interface.

In accordance with one embodiment, the cabinet includes a plurality of rack mountable chassis. A first one of such chassis includes a memory and a plurality of directors for controlling data transfer between a host computer/server and a bank of disk drives as such data passes through the memory. A first plurality of the directors is adapted for coupling to the host computer/server. A second plurality of the directors is adapted for coupling to a bank of disk drives. A second one of such chassis includes a plurality of disk drives. Electrical conductors are provided for connecting the disk drives in the second chassis to the second plurality of directors in the first chassis.

In one embodiment, the cabinet includes a plurality of rack mountable chassis. A first one of such chassis includes a memory and a plurality of directors. A first plurality of the directors is adapted for coupling to a host computer/server. A second one of such chassis has a plurality of disk drives. Also includes are first electrical conductors for connecting the disk drives in the second chassis to a second plurality of directors in the first one of the chassis. A third one of such chassis includes a memory and a plurality of directors. The first plurality of the directors in the third one of the chassis are adapted for coupling to the host computer/server. A fourth one of such chassis has a plurality of disk drives. Second electrical conductors are provided for connecting the disk drives in the fourth of the chassis to a second plurality of directors in the third one of the chassis. Third electrical connectors are provided for electrically the memories in the first one of the chassis and the third one of such chassis to enable the first plurality of directors and the second plurality of directors in the first and third ones of the chassis to control data transfer between a host computer/server and a bank of disk drives as such data passes through the memories the first one of the chassis and in the third one of the chassis.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 6D is a perspective view of the backplane used in such chassis;

Like reference symbols in the various drawings indicate like elements.

DETAILED DESCRIPTION

Figure 2:
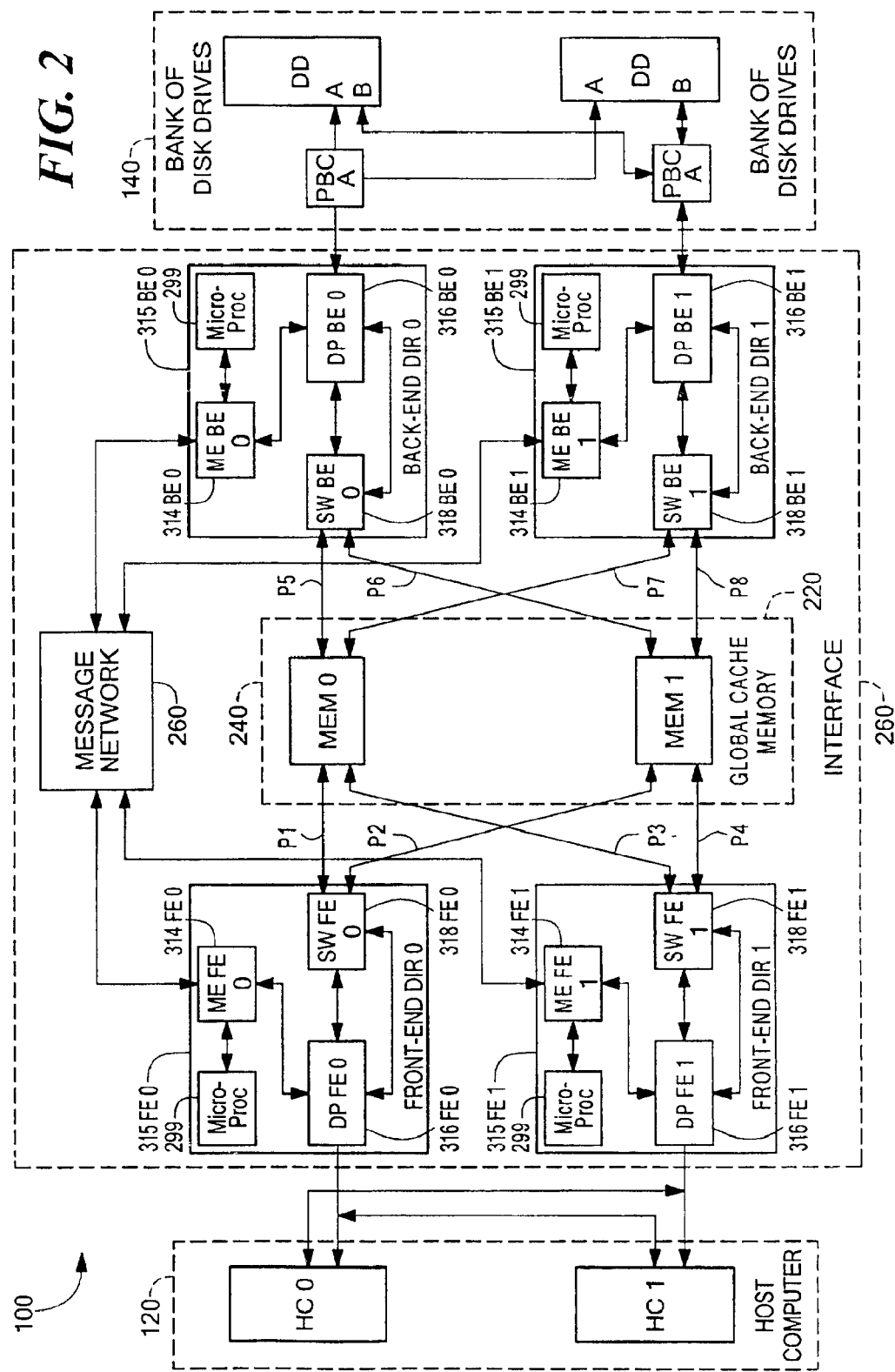
FIG. 2 is a block diagram of a data storage system according to the invention.

Referring now to FIG. 2, a data storage system 100 is shown for transferring data between a host computer/server 120 and a bank of disk drives 140 through a system interface 160. The system interface 160 includes: a plurality of, here 2 front-end directors 315FE0, 315FE1 coupled to the host computer/server 120; a plurality of, here 2 back-end directors 315BE0, 315BE1 coupled to the bank of disk drives 140; a data transfer section 240, having a global cache memory 220, coupled to the plurality of front-end directors 315FE0. 315FE1 and the back-end directors 315BE0, 315BE1; and a messaging network 260, operative independently of the data transfer section 240, coupled to the plurality of front-end directors 315FE0, 315FE1 and the plurality of back-end directors 315BE0, 315BE1, as shown. It should be noted that a more complete description of the system is described in patent application Ser. No. 09/540, 828 filed Mar. 31, 2000, inventor Yuval Ofek et al., assigned to the same assignee as the present invention, the entire subject matter thereof being incorporated by reference. Suffice it to say here, however, that die front-end and back-end directors 315FE0,315FE1, 315BE0, 315BE1 are functionally similar and include a microprocessor ($\mu$P) 299 (i.e., a central processing unit (CPU) and RAM), a message engine/CPU controller 314 and a data pipe, as described in detail in the above-referenced patent application. The data pipe for the front-end director 315FE0 is designated 316FE0, the data pipe for the front-end director 315FE1 is designated 316FE1, the data pipe for the back-end director 315BE0 is designated 316BE0, and the data pipe for the back-end director 315BE1 is designated 316BE1.

Each one of the directors 315FE0, 315FE1, 315BE0, 315BE1, is coupled to the global cache memory 220 in a point-to-point configuration. More particularly, the global cache memory 220 here has two memory sections, MEM 0 and MEM 1. Each one of the directors 315FE0, 315FE1, 315BE0, 315BE1, is coupled to both of the memory sections MEM 0 and MEM 1. Each memory section is provided on a separate printed circuit board, to be described in more detail below.

Each one of the directors 315FE0, 315FE1, 315BE0, 315BE1 has a corresponding one of four switches 318FE0, 318FE1, 318BE0, and 318FE1, respectively, as indicated. Switch 318FE0 is adapted to couple director 315FE0 to either memory section MEM 0 or MEM 1 via point-to-point data paths P1 or P2, respectively. Switch 318FE1 is adapted to couple director 180FE1 to either memory section MEM 0 or MEM 1 via point-to-point data paths P3 or P4, respectively. Switch 318BE0 is adapted to couple director 315BE0 to either memory section MEM 0 or MEM 1 via point-to-point data paths P5 or P6, respectively. Switch 318BE1 is adapted to couple director 315BE1 to either memory section MEM 0 or MEM 1 via point-to-point data paths P7 or P8, respectively. More particularly, switch 318FE0 is adapted to couple the data pipe 316FE0 of director 315FE0 to either memory section MEM 0 or MEM 1. Switch 318FE1 is adapted to couple the data pipe 316FE1 of director 315FE1 to either memory section MEM 0 or MEM 1. Switch 318BE0 is adapted to couple the data pipe 316FB0 of director 315BE0 to either memory section MEM 0 or MEM 1. Switch 3198BE1 is adapted to couple the data pipe 316FB1 of director 315BE1 to either memory section MEM 0 or MEM 1.

In operation, and considering first a read request by the host computer/server 120 (i.e., the host computer/server 120 requests data from the bank of disk drives 140), the request is passed from one the host computer 120 to one or more of the pair of the front-end directors 315FE0, 315FE1 connected to such host computer 120. It is noted that each one of the host computer processors HC0, HC1 is coupled to the pair of the front-end directors 315FE0, 315FE1 to provide redundancy in the event of a failure in one of the front-end directors 315FE0, 315FE1 coupled thereto. Likewise, the bank of disk drives 140 has a plurality of disk drives DD, each DD having a pair of redundant ports A and B and being coupled to a pair of the back-end directors 315BF0, 315BE1, through a redundant pair of port by-pass cards (PBCs) PBC 0A, PBC A to provide redundancy in the event of a failure in one of the back-end directors 213BE0, 315BE1. Each front-end director 315FE0, 315FE1 includes a microprocessor ($\mu$P) 299 (i.e., a central processing unit (CPU) and RAM) and described in detail in the above-referenced patent application. Suffice it to say here, however, that the microprocessor 299 makes a request for the data from the global cache memory 220. The global cache memory 220 has a resident cache management table, not shown. Every director 315FE0, 315FE1, 315FE0, 315BE1 has access to the resident cache management table and every time a front-end director 315FE0, 315FE1 requests a data transfer, the front-end director, 315FE0, must query the global cache memory 220 to determine whether the requested data is in the global cache memory 220. 1f the requested data is in the global cache memory 220 (i.e., a read "hit"), the front-end director 315FE0, 315FE1, more particularly the microprocessor 299 therein, mediates a DMA (Direct Memory Access) operation for the global cache memory 220 and the requested data is transferred to the requesting host computer processor HC0, HC1.

If, on the other hand, the front-end director 315FE0, 315FE1 receiving the data request determines that the requested data is not in the global cache memory 220 (i.e., a "miss") as a result of a query of the cache management table in the global cache memory 220, such front-end director, 315FE0, 315FE1 concludes that the requested data is in the bank of disk drives 140. Thus the front-end director 315FE0, 315FE1 that received the request for the data must make a request for the data from one of the back-end directors 315BE0, 315BE1 in order for such back-end director 315BE0, 315BE1 to request the data from the bank of disk drives 140. The mapping of which back-end directors 315BE0, 315BE1 control which disk drives DD in the bank of disk drives 140 is determined during a power-up initialization phase. The map is stored in the global cache memory 220. Thus, when the front-end director 315FE0, 315FE1 makes a request for data from the global cache memory 220 and determines that the requested data is not in the global cache memory 220 (i.e., a "miss"), the front-end director 315FE0, 315FE1 is also advised by the map in the global cache memory 220 of the back-end director 315BE0, 315BE1 responsible for the requested data in the bank of disk drives 140. The requesting front-end director 315FE0, 315FE1 then must make a request for the data in the bank of disk drives 140 from the as designated back-end director 315BE0, 315BE1. This request between the front-end director 315FE0, 315FE1 and the appropriate one of the back-end directors 315BE0, 315BE1 (as determined by the map stored in the global cache memory 220) is by a message which passes from the front-end director 315FE0, 315FE1 through the message network 260 to the appropriate back-end director 315BE0, 315BE1. 1t is noted then that the message does not pass through the global cache memory 220 (i.e., does not pass through the data transfer section 240) but rather passes through the separate, independent message network 260. Thus, communication between the directors 315FE0, 315FE1, 315BE0, 31BFE1 is through the message network 260 and not through the global cache memory 220. Consequently, valuable bandwidth for the global cache memory 220 is not used for messaging among the directors 315FE0, 315FE, 315BE0, 315BE1.

Thus, on a global cache memory 220 "read miss", the front-end director 315FE0, 315FE1 sends a message to the appropriate one of the back-end directors 315BE0, 315BE1 through the message network 260 to instruct such back-end director 315BE0, 315BE1 to transfer the requested data from the bank of disk drives 140 to the global cache memory 220.

When accomplished, the back-end director 315BE0, 315BE1 advises the requesting front-end director 315FE0, 315FE1 that the transfer is accomplished by a message, which passes from the back-end director 315BE0, 315BE1 to the front-end director 315FE0, 315FE1 is through the message network 260. In response to the acknowledgement signal, the front-end director 315FE0, 315FE1 is thereby advised that such front-end director 315FE0, 315FE1 can transfer the data from the global cache memory 220 to the requesting host computer processor HC0, HC1 as described above when there is a cache "read hit".

It should be noted that there might be one or more back-end directors 315BE0, 315BE1 responsible for the requested data. Thus, if only one back-end director 315BE0, 315BE1 is responsible for the requested data, the requesting front-end director 315FE0, 315FE1 sends a uni-cast message via the message network 260 to only that specific one of the back-end directors 315BE0, 315BE1. On the other hand, if more than one of the back-end directors 315BE0, 315BE1 is responsible for the requested data, a multi-cast message (here implemented as a series of uni-cast messages) is sent by the requesting one of the front-end directors 315FE0, 315FE1 to all of the back-end directors 315BE0, 315BE1 having responsibility for the requested data. In any event, with both a uni-cast or multi-cast message, such message is passed through the message network 260 and not through the data transfer section 240 (i.e., not through the global cache memory 220).

Likewise, it should be noted that while one of the host computer processors HC0, HC1 might request data, the acknowledgement signal may be sent to the requesting host computer processor HC0 or one or more other host computer processors HC0, HC1 via a multi-cast (i.e., sequence of uni-cast) messages through the message network 260 to complete the data read operation.

Considering a write operation, the host computer 120 wishes to write data into storage (i.e., into the bank of disk drives 140). One of the front-end directors 315FE0, 315FE1 receives the data from the host computer 120 and writes it into the global cache memory 220 and marks the data as "fresh data" at the end of the write. This is when the data is marked "write pending". Also, from the onset of the write until the completion of the write, the front end director must also mark the slot in the cache memory "locked" to prevent other directors from reading half-written data.

After some period of time, the back end director 315BE0, 315BE1 determines that the data must be removed from such cache memory 220 and stored in the bank of disk drives 140. More particularly, the back end directors monitor the number "write pending" entries for the cache memory 220 and compare it with an a priori established parameter called "Write Pending Threshold". The back end directors also check the age of the data in the cache memory 220 to determine whether it exceeds an a priori established excessive period of time. Before the transfer to the bank of disk drives 140, the data in the cache memory 220 was tagged with a bit as "fresh data" (i.e., data which has not been transferred to the bank of disk drives 140, that is data which is "write pending"). This tagging occurs when data is first written into the cache memory. Thus, if there are multiple write requests for the same memory location in the global cache memory 220 (e.g., a particular bank account) before being transferred to the bank of disk drives 140, the data is overwritten in the cache memory 220 with the most recent data. Each time data is transferred to the global cache memory 220, the front-end director 315FE0, 315FE1 controlling the transfer also informs the host computer 120 that the transfer is complete to thereby free-up the host computer 120 for other data transfers.

When it is time to transfer the data in the global cache memory 220 to the bank of disk drives 140, as determined by the back-end director 315BE0, 315BE1, the back-end director 315BE0, 315BE1 transfers the data from the global cache memory 220 to the bank of disk drives 140 and resets the tag associated with data in the global cache memory 220 (i.e., un-tags the data) to indicate that the data in the global cache memory 220 has been transferred to the bank of disk drives 140. It is noted that the un-tagged data in the global cache memory 220 remains there until overwritten with new data.

As noted above, further detail is provided in the above-referenced patent application. Suffice it to say here, however, that the front-end and back-end directors 315FE0, 315FE1, 315BE0, 315BE1 control data transfer between the host computer/server 120 and the bank of disk drives 140 in response to messages passing between the directors 315FE0, 315FE1, 315BE0, 315BE1 through the messaging network 260. The messages facilitate the data transfer between host computer/server 120 and the bank of disk drives 140 with such data passing through the global cache memory 220 via the data transfer section 240. More particularly, in the case of the front-end directors 315FE0, 315FE1 the data passes between the host computer to the global cache memory 220 through the data pipe 316 in the front-end directors 315FE0, 315FE1 and the messages pass through the message engine/CPU controller 314 in such front-end directors 315FE0, 315FE1 the data passes between the back-end directors 315BE0, 315BE1 and the bank of disk drives 140 and the global cache memory 220 through the data pipe 316 in the back-end directors 315BE0, 315BE1 and again the messages pass through the message engine/CPU controller 314 in such back-end director 315BE0, 315BE1.

With such an arrangement, the cache memory 220 in the data transfer section 240 is not burdened with the task of transferring the director messaging. Rather the messaging network 260 operates independent of the data transfer section 240 thereby increasing the operating bandwidth of the system interface 160.

It should be noted that the data pipes 316BE0 and 316BE1 of back-end directors 315BE0, 315BE1 directors are coupled to a pair of fiber channel port by-pass card (PBC) units PBC A and PBC B, respectively, as shown, in the bank of disk drives 140. The bank of disk drives 140 includes a plurality of disk drives DD, each one having a pair of redundant ports A and B. The PBC A is coupled to the port A of the disk drives and the PBC B is coupled to the port B of the disk drives, as shown, and as described in more detail in patent application Ser. No. 09/343,344 filed Jun. 30, 1999, inventor Mulvey et al., assigned to the same assignee as the present invention, the entire subject matter being incorporated herein by reference. The data pipes 316FE0 and 316FE1 of front-end directors 315FE0, 315FE1 directors are coupled to a pair of host computer processor HC0 and HC1 of the host computer 120, as shown.

As noted above, the global memory cache 220 here has two memory printed circuit boards MEM 0 and MEM 1. Each one of the memory boards MEM 0 and MEM 1 is accessible from the pair of front-end directors 315FE0, 315FE1 and also from the pair of back-end directors 315BE0, 315BE1.

Figure 3A:
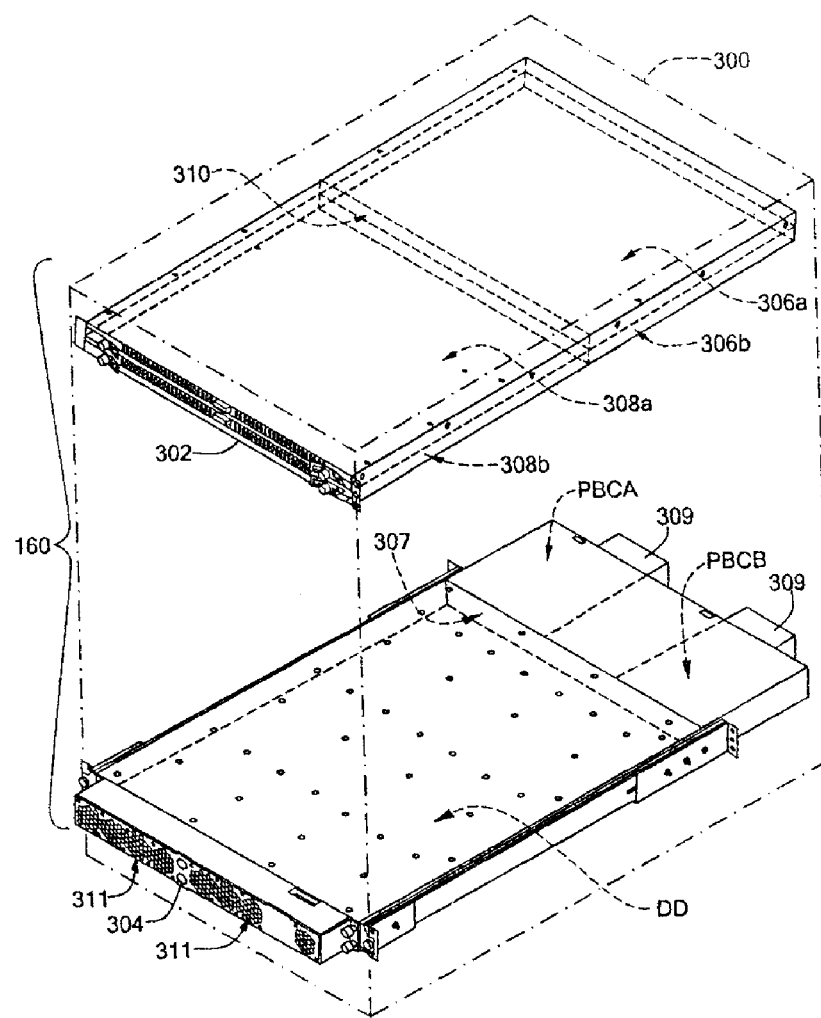
FIGS. 3A and 3B are exploded perspective views of a cabinet, shown in phantom in FIG. 3A, having therein a pair of chassis connected to provide the data storage system of FIG. 2, FIG. 3A being a front perspective view and FIG. 3B being a rear perspective view, the cover being removed from the rear portion of the lower one of the chassis, one of a pair of port by-pass cards (PBCs) being shown in a partially retracted portion in FIG. 3B.
Figure 3B:
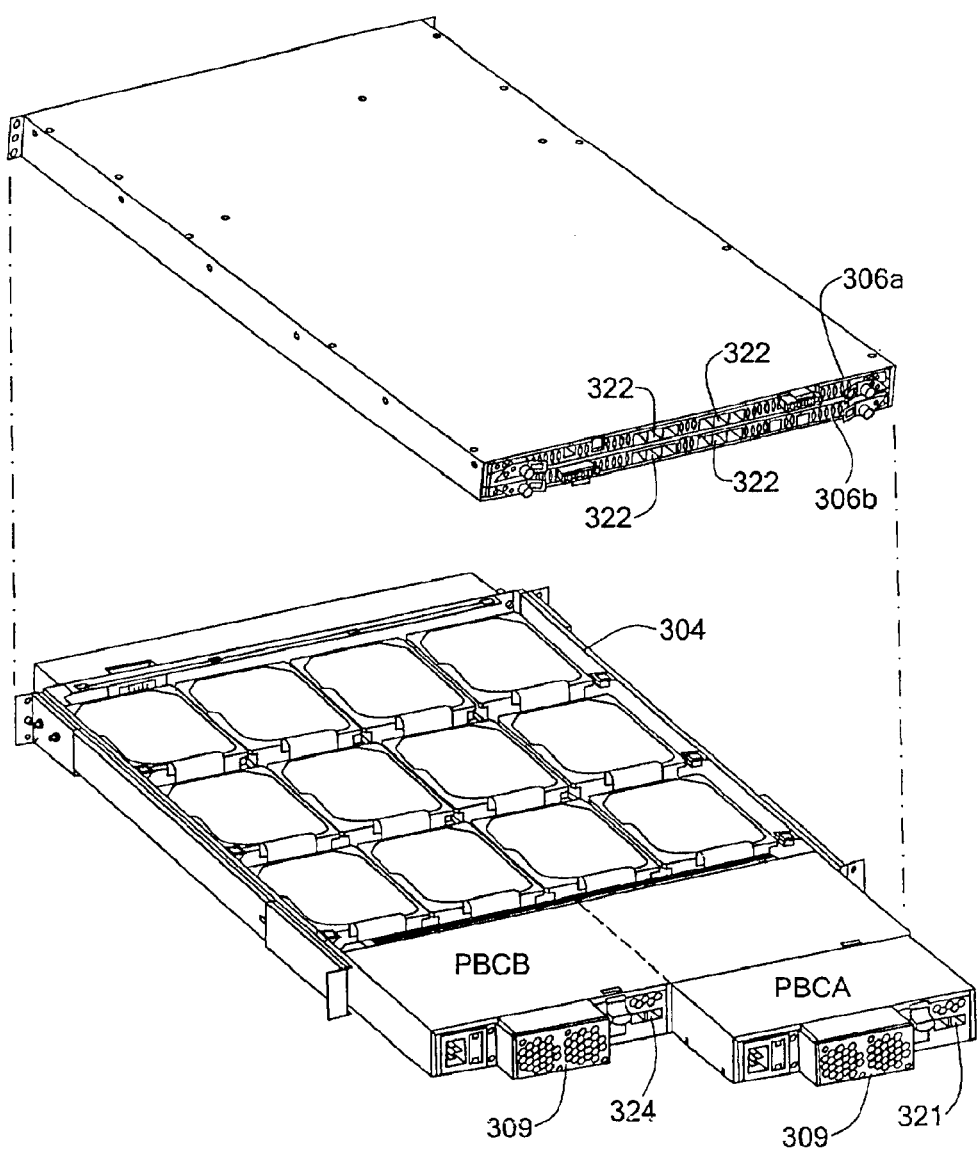

Referring to FIGS. 3A and 3B, the data storage system interface 160 is shown. The interface 160 includes a cabinet 300 having a pair of upper and lower rack mountable, here 1U chassis 302, 304, respectively, as shown.

Disposed in the upper one of the chassis 302 are four printed circuit boards 306a, 306b, 308a, and 308b and a backplane 310. An upper and lower pair of the four printed circuit boards, here printed circuit boards 306a and 306b are a pair of director boards. The upper and lower printed circuit boards 308a and 308b are the pair of memory boards MEM 0 and MEM 1, respectively. The director boards 308a and 308b plug into one side of the backplane 310 and the pair of memory boards MEM 0 and MEM 1 plug into the opposite side of the backplane 310. The backplane 310 provide the electrical interconnection between the four printed circuit boards 306a, 306b, 308a and 308b, in a manner shown, and to be described in more detail in connection with FIG. 4.

Figure 1:
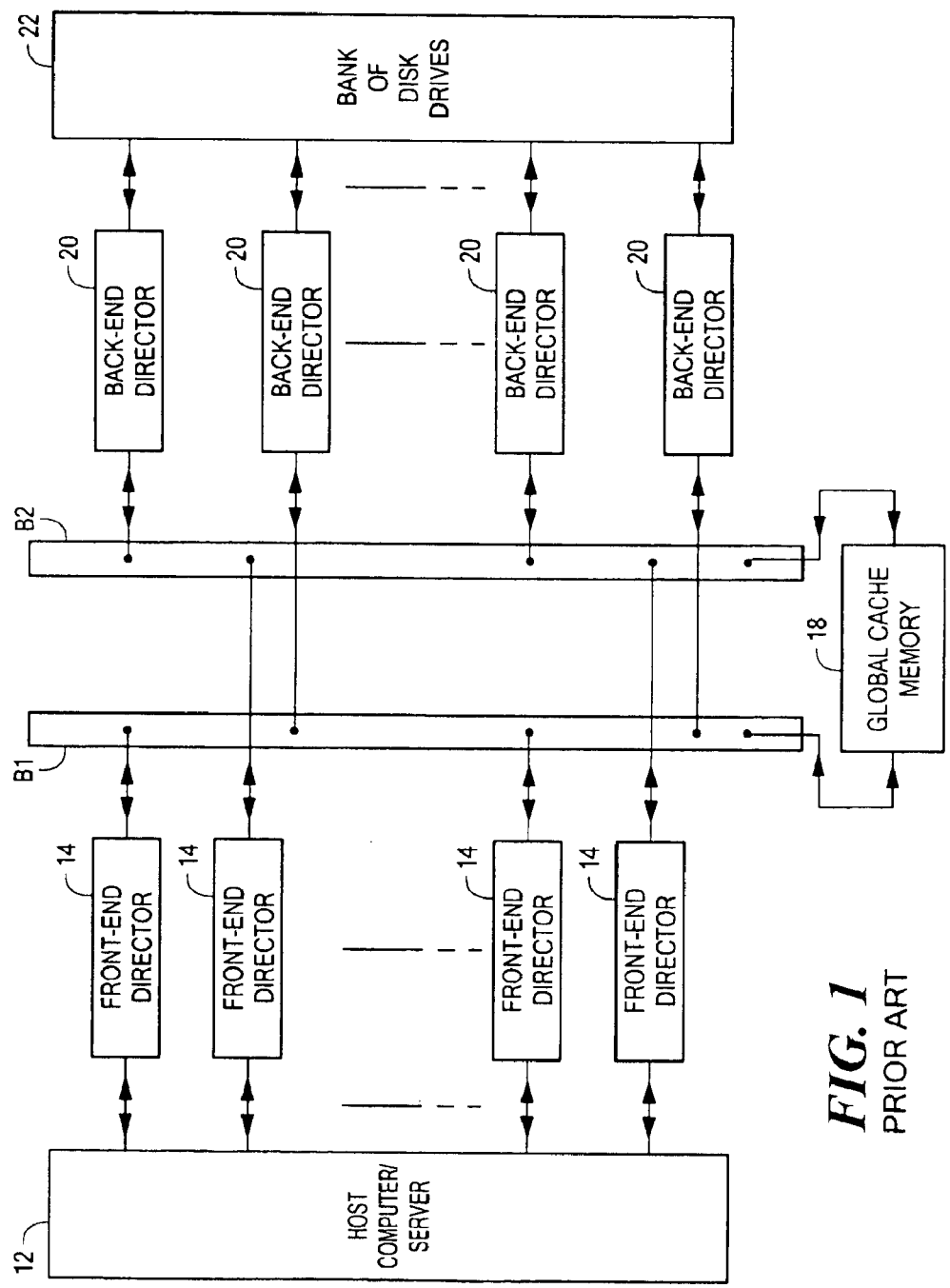
FIG. 1 is a block diagram of a data storage system according to the PRIOR ART.

Disposed in the lower one of the chassis 304 is the bank of disk drives 140 (FIG. 1), i.e., the pair of PBC card units PBC A and PBC B together with the array of disk drives DD. The array of disk drives DD and the PBC units PBC A and PBC B are electrically interconnected through a backplane printed circuit board 307. Also provided are a pair of fans 309 at the rear of the chassis and cooling apertures 311 at the front of the chassis Referring now in more detail to the upper chassis 302, reference is made to FIG. 4. The director printed circuit board 306a has thereon front end director 315FE0 and back end director 315BE0. The back end director 315BE0 includes: the back end data pipe 316BE0 adapted for coupling to the PBC A of chassis 304 via a cable 400 external of chassis 302 and chassis 304; the back end message engine 314BE0 which is coupled thereto the back end data pipe 316BE0 and a microprocessor 199; a portion of the message network 260 (FIG. 2), i.e., message network $260_0$ coupled to the back end message engine 314BE0; and a crossbar switch network $318_0$. Switch network $318_0$ includes a switch $318_A$ coupled to the back end data pipe 316BE0 and to a port A of the director board 306a.

The front end director 315FE0 includes: the front end data pipe 316FE0 adapted for coupling to the host computer 120 (FIG. 1) via a cable 402 external of chassis 302 and to switch $318_A$; the front end message engine 314FE0 which is coupled thereto the front end data pipe 316FE0 and a microprocessor 199; the portion of the message network 260 (FIG. 2), i.e., message network $260_0$ coupled to the front end message engine 314FE0. The portion of the message network $260_0$ is coupled to port C of the director board 306a. Also on the printed circuit board 306a is a switch $318_B$ included in the crossbar switch newtork $318_0$. The switch $318_B$ is coupled to: the front end data pipe 316FE0; the back end data pipe 316BE0; and a B port of the director board 306a.

Thus, the back end data pipe 316BE0 may be coupled to either port A or Port B of the director board 306a via switches $318_A$ and $318_B$ in the crossbar switch network $318_0$. Likewise, the front end data pipe 316FE0 may be coupled to either port A or Port B of the director board 306a via switches $318_A$ and $318_B$. Further both the front end and back end data pipes 316FE0 and 316BE0 are coupled to the message network $206_0$.

The director printed circuit board 306b is identical in physical layout to the director board 306a. Thus, the physical components and the physical layout of those components and Ports A, B and C thereof are identical on both director boards 306a and 306b. Thus, they are interchangeable. However, they are connected differently to the host computer and the bank of disk drives externally of the chassis. Further, they are interconnected to the memory printed circuit boards via interconnects in the backplane 310.

The boards 306a and 306b are disposed within the chassis 302 in overlaying relationship but with one of the boards being back-to-back with respect to the other. That is, the boards 306a and 306b boards have the same physical layout. The electrical components are disposed on one side of each of the boards and face outwardly from the interior of the chassis. Thus, the surfaces of the boards without the components face each other and are in a back-to-back relationship, as will be described in more detail in connection with FIG. 5. Suffice it to say here, however, that director printed circuit board 306b has a front end director 315FE1 and a back end director 315BE1. The back end director 315BE1 includes: the back end data pipe 316BE1 adapted for coupling to the PBC B of chassis 304 via a cable 406 external of chassis 302 and chassis 304; the back end message engine 314BE1 which is coupled thereto the back end data pipe 316BE1 and a microprocessor 199; a portion of the message network 260 (FIG. 2), i.e., message network 260, coupled to the back end message engine 314BE1; and a switch $318_A$ of switch network $318_0$ coupled to the back end data pipe 316BE1 and to a port A of the director board 306a.

The front end director 315FE1 includes: the front end data pipe 316FE1 adapted for coupling to the host computer 120 (FIG. 1) via a cable 404 external of chassis 302 and to switch $318_A$; the front end message engine 314FE1 which is coupled thereto the front end data pipe 316FE1 and a microprocessor 199; the other portion of the message network 260 (FIG. 2), i.e., message network $260_1$ coupled to the front end message engine 314FE1. The portion of the message network $260_1$, is coupled to port C of the director board 306b. Also on the printed circuit board 306b is a switch $318_B$ of switch network $318_0$ coupled to: the front end data pipe 316FE1; the back end data pipe 316BE1; and a B port of the director board 306a.

Thus, the back end data pipe 316BE1 may be coupled to either port A or Port B of the director board 306b via switches $318_A$ and $318_B$. Likewise, the front end data pipe 316FE1 may be coupled to either port A or Port B of the director board 306b via switches $318_A$ and $318_B$ of switch network $318_1$. Further, both the front end and back end data pipes 316FE1 and 316BE1 arc coupled to the message network $206_1$.

As described in the first-mentioned patent application, the message network 260, $260_0$ and $260_1$, are switches that enable each one of the data pipes 316BE0, 316FE0, 316BE1 and 316FE1 to communicate with each other.

As noted above, each the chassis 302 includes a pair of memory printed circuit boards 308a and 308b. Each one of the memory boards is identical in physical construction and layout. Each one includes a memory region coupled to a pair of ports Port A and Port B thereof through a switch SW. Reference is made to U.S. Pat. No. 5,943,287, issued Aug. 24, 1999, inventor John Walton, assigned to the same assignee as the present invention, the entire subject matter thereof being incorporated herein by reference. The pair of memory printed circuit boards are disposed within the chassis 302 in overlaying relationship but with one of the boards also being back-to-back with respect to the other as will be described in more detail in connection with FIG. 5.

Figure 4:
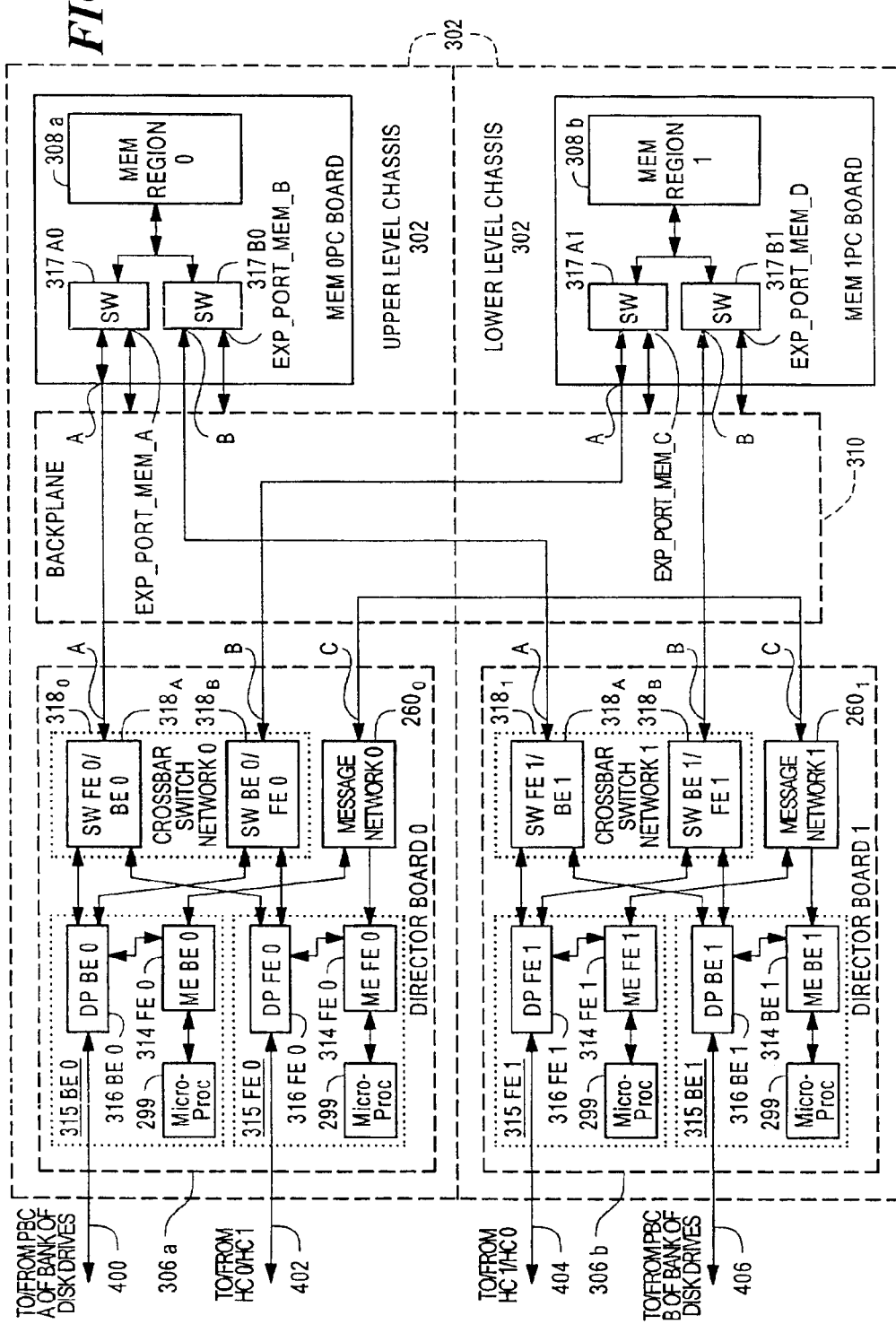
FIG. 4 is one of the chassis in FIGS. 3A and 3B, such chassis having therein a pair of director boards, a pair of memory boards and a backplane to electrically interconnect such boards to provide a portion of the data system of FIG. 2.

More particularly, the printed circuit board 308a, includes a pair of switches 317A0, 317B0, as shown in FIG. 4. Each one of the switches 317A0, 317B0 here has two ports connected to the backplane 310 and a port connected to the memory region on the printed circuit board 308a. Thus, considering an exemplary one of the switches, here switch 317A0, such switch 317A0 has a pair of ports A and EXP_PORT_MEM_A. Port A of switch 317A0 is connected to switch 318A of the director board 0. The other port, EXP_PORT_MEM_A is for expansion and will be described in more detail in connection with FIGS. 4B, 4C, 4D and 4E. In like manner, switch 317B0 has an expansion port EXP_PORT_MEM_B.

In like manner, the printed circuit board 308b, includes a pair of switches 317A1, 317B1, as shown in FIG. 4. Each one of the switches 317A1, 317B1 here has two ports connected to the backplane 310 and a port connected to the memory region on the printed circuit board 308b. Thus, considering an exemplary one of the switches, here switch 317A1, such switch 317A1 has a pair of ports A and EXP_PORT_MEM_C. Port A of switch 317A1 is connected to switch 318b of the director board 0. The other port, EXP_PORT_MEM_C is for expansion and will be described in more detail in connection with FIGS. 4B, 4C, 4D and 4E. In like manner, switch 317B1 has an expansion port EXP_PORT_MEM_D.

Backplane 310 is used to electrically interconnect the four printed circuit boards 306a, 306b, 308a and 308b. More particularly: Port A of board 306a is connected to Port A of memory board 308a; Port B of board 306a is connected to Port A of board 308b; Port C of board 306a is connected to Port C of board 306b; Port A of board 306b is connected to Port B of memory board 308a; and Port B of board 306b is connected to Port B of board 308b. Thus, with this arrangement, each one of the data pipes 316BE0, 316FE0, 316BE1 and 316FE1 has access to both memory regions. Further, as noted above, all of the data pipes 316BE0, 316FE0, 316BE1 and 316FE1 have access to each other.

Figure 4A:
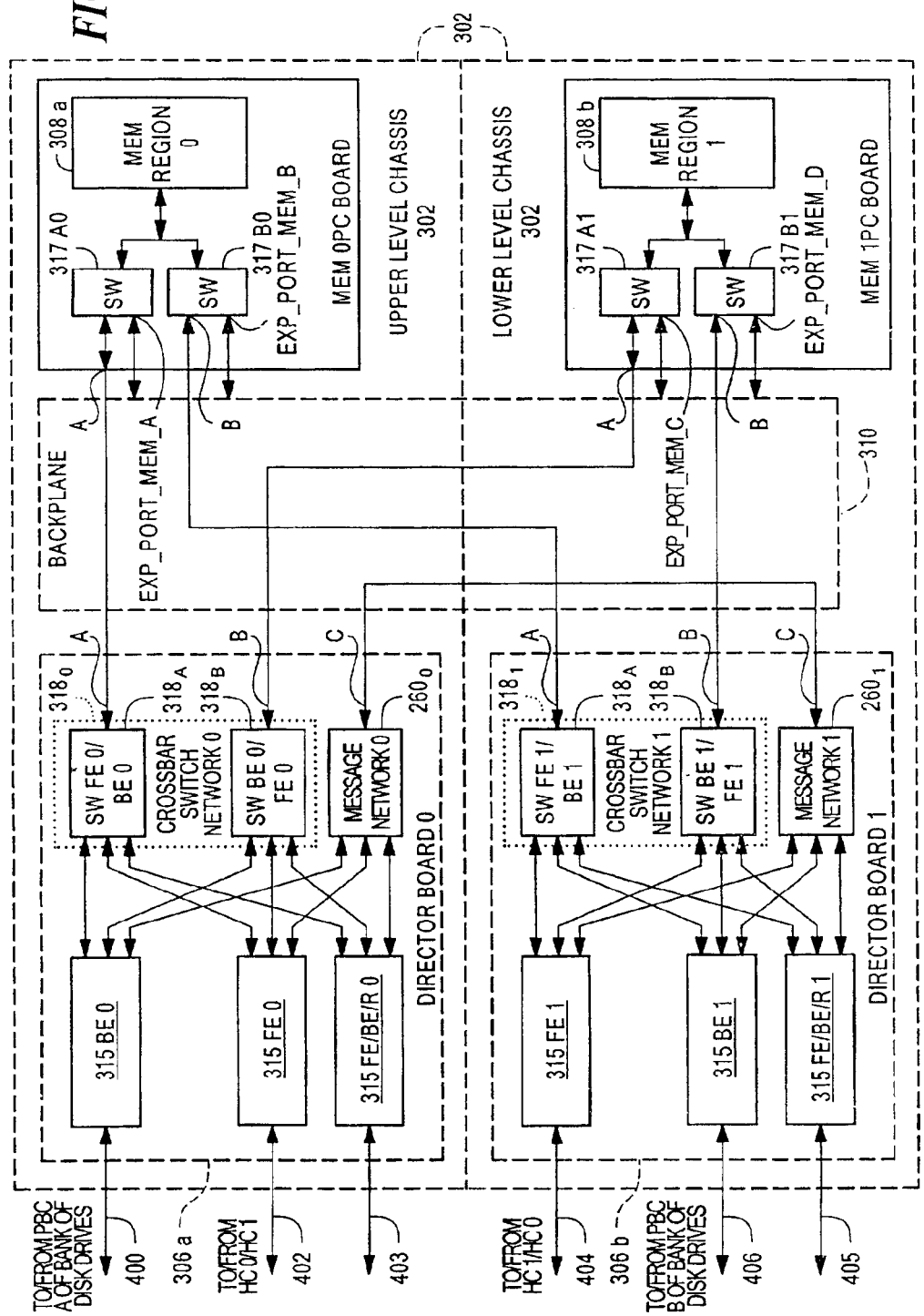
FIG. 4A is an alternative embodiment of the chassis of FIG. 4, such chassis having therein a pair of director boards, a pair of memory boards and a backplane to electrically interconnect such boards to provide a portion of the data system of FIG. 2.

Referring now to FIG. 4A, here, in this embodiment, each director board 306a, 306b has three directors: the front end directors 315FE0, 315FE1, respectively: the back end directors 315BE0, 315BE1, respectively; and additional directors 315FE/BE/R0, 315FE/BE/R1, respectively, as shown. Each additional director 315FE/BE/R0, 315FE/BE/R1 may serve as: front end directors, in which case such directors would be coupled to host computers, not shown, via cables 403, 405, respectively; back end directors, in which case such directors would be coupled to port by-pass card units, not shown; or, directors for a remote facility, not shown, via cables 403, 405.

Figure 4B:
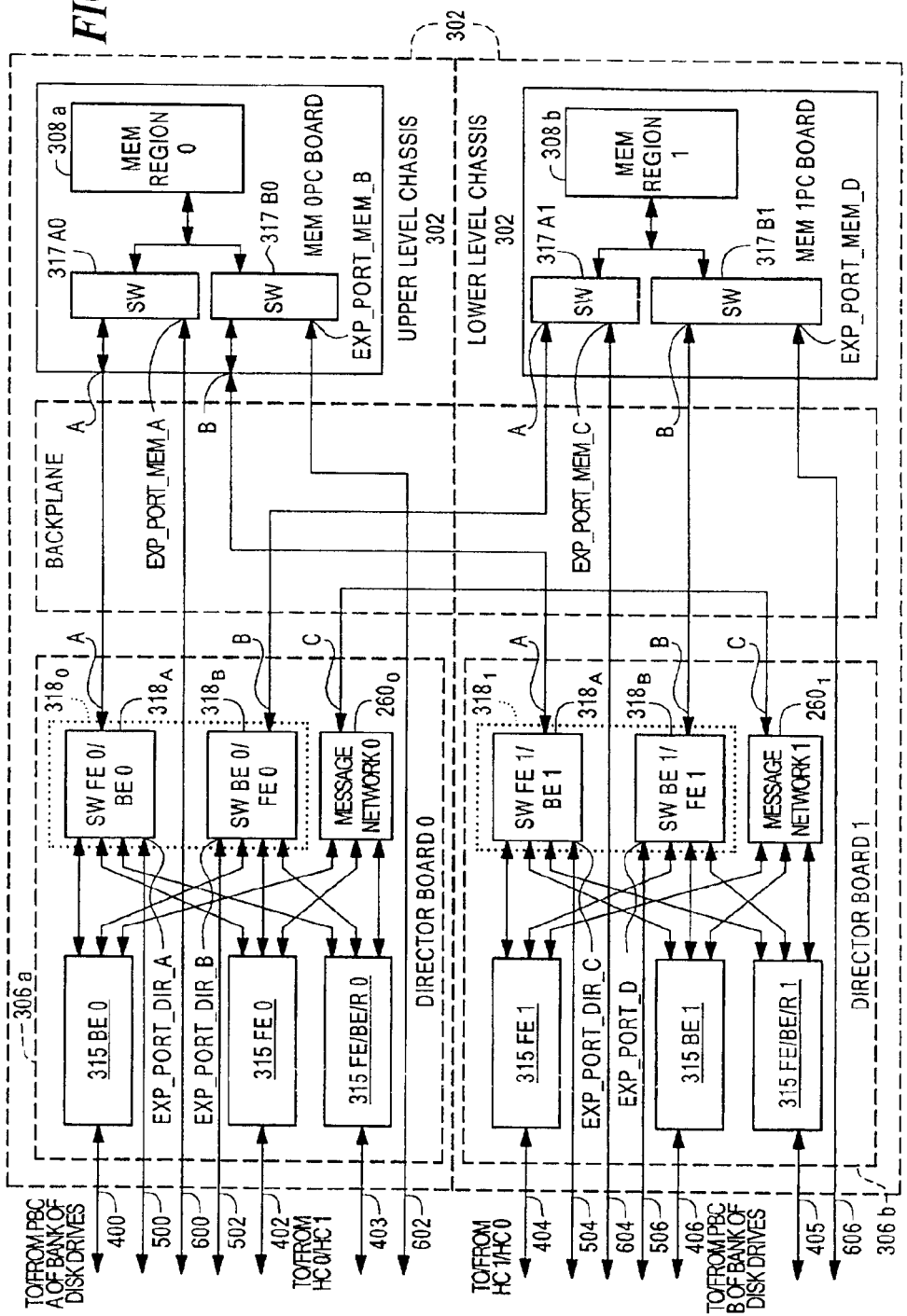
FIG. 4B is an another alternative embodiment of the chassis of FIG. 4, such chassis having therein a pair of director boards, a pair of memory boards and a backplane to electrically interconnect such boards to provide a portion of the data system of FIG. 2.

Referring now to FIG. 4B, the switches 418A and 418B in each in the director boards 306a and 306b of the embodiment shown in FIG. 4A include an additional port. Thus, the switch 318A in board 306a includes an expansion port EXP_PORT_DIR_A, the switch 318B in board 306a includes an expansion port EXP_PORT_DIR_B, the switch 318A in board 306b includes an expansion port EXP_PORT_DIR_C, and the switch 318B in board 306b includes an expansion port EXP_PORT_DIR_D. The expansion port EXP_PORT_DIR_A is adapted for coupling to port A of switch 318A of board 306a; the expansion port EXP_PORT_DIR_B is adapted for coupling to port B of switch 318B of board 306a; the expansion port EXP_PORT_DIR_C is adapted for coupling to port A of switch 318A of board 306b; and, the expansion port. EXP_PORT_DIR_D is adapted for coupling to port B of switch 318B of board 306b.

Figure 4C:
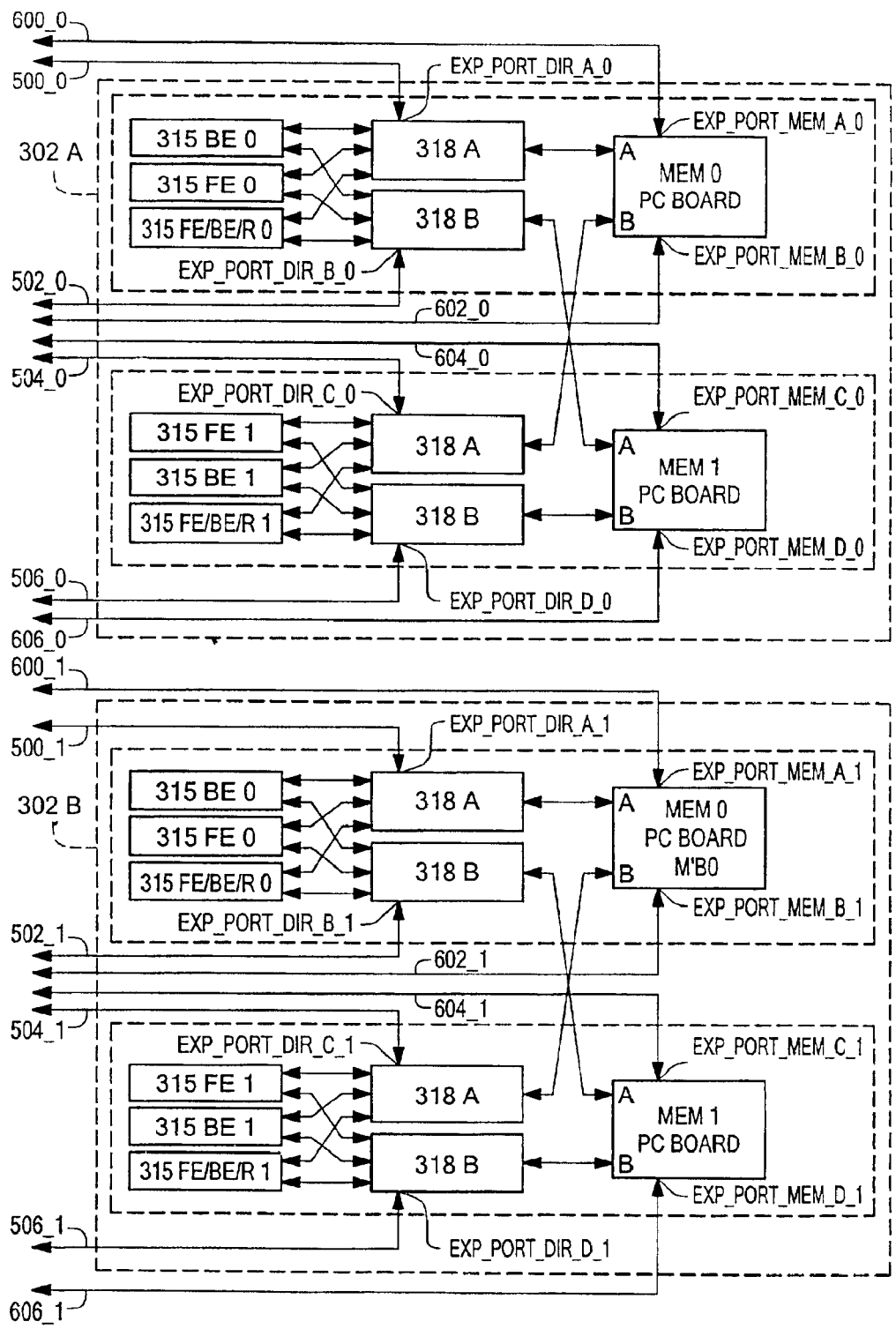
FIG. 4C is a pair of interconnected chassis in FIGS. 3A and 3B, each on of such chassis being in accordance with the chassis of FIG. 4B.

Referring to FIG. 4C, two identical chassis 302 (FIG. 4B), here designated as 302A and 302B, are electrically interconnected via the expansion ports EXP_PORT_DIR_A, EXP_PORT_DIR_B, EXP_PORT_DIR-C, and EXP_PORT_DIR_D and via the memory expansion ports EXP_PORT_MEM_A, EXP_PORT_MEM_B, EXP_PORT_MEM_C, and EXP_PORT_MEM_D, described above in connection with FIG. 4, to provide a system with twice the memory.

The director expansion ports EXP_PORT_DIR_A, EXP_PORT_DIR_B, EXP_PORT_DIR_C, and EXP_PORT_DIR_D for chassis 302A are designated as EXP_PORT_DIR_A_0, EXP_PORT_DIR_B_0, EXP_PORT_DIR_C_0, and EXP_PORT_DIR_D_0, , respectively, and are connected to cables 500_0, 502_0, 504_0 and 506_0, respectively.

The director expansion ports EXP_PORT_DIR_A, EXP_PORT_DIR_B, EXP_PORT_DIR_C, and EXP_PORT_DIR_D for chassis 302B are designated as EXP_PORT_DIR_A_1, EXP_PORT_DIR_B_1, EXP_PORT_DIR_C_1, and EXP_PORT_DIR_D_1, respectively, and are connected to cables 500_1, 502_1, 504_1 and 506_1, respectively.

The memory expansion ports EXP_PORT_MEM_A, EXP_PORT_MEM_B, EXP_PORT_MEM C, and EXP_PORT_MEM_D for chassis 302A are designated as EXP_PORT_MEM_A_0, EXP_PORT_MEM_B_0, EXP_PORT_MEM_C_0, and EXP_PORT_MEM_D_0, respectively, and are connected to cables 600_0, 602_0, 604_0 and 606_0, respectively.

The memory expansion ports EXP_PORT_MEM_A, EXP_PORT_MEM_B, EXP_PORT_MEM_C, and EXP_PORT_MEM_D for chassis 302B are designated as EXP_PORT_MEM_A_1, EXP_PORT_MEM_B_1, EXP_PORT_MEM_C_1, and EXP_PORT_MEM_D_1, respectively, and are connected to cables 600_1, 602_1 604_1 and 606_1, respectively.

Figure 4D:
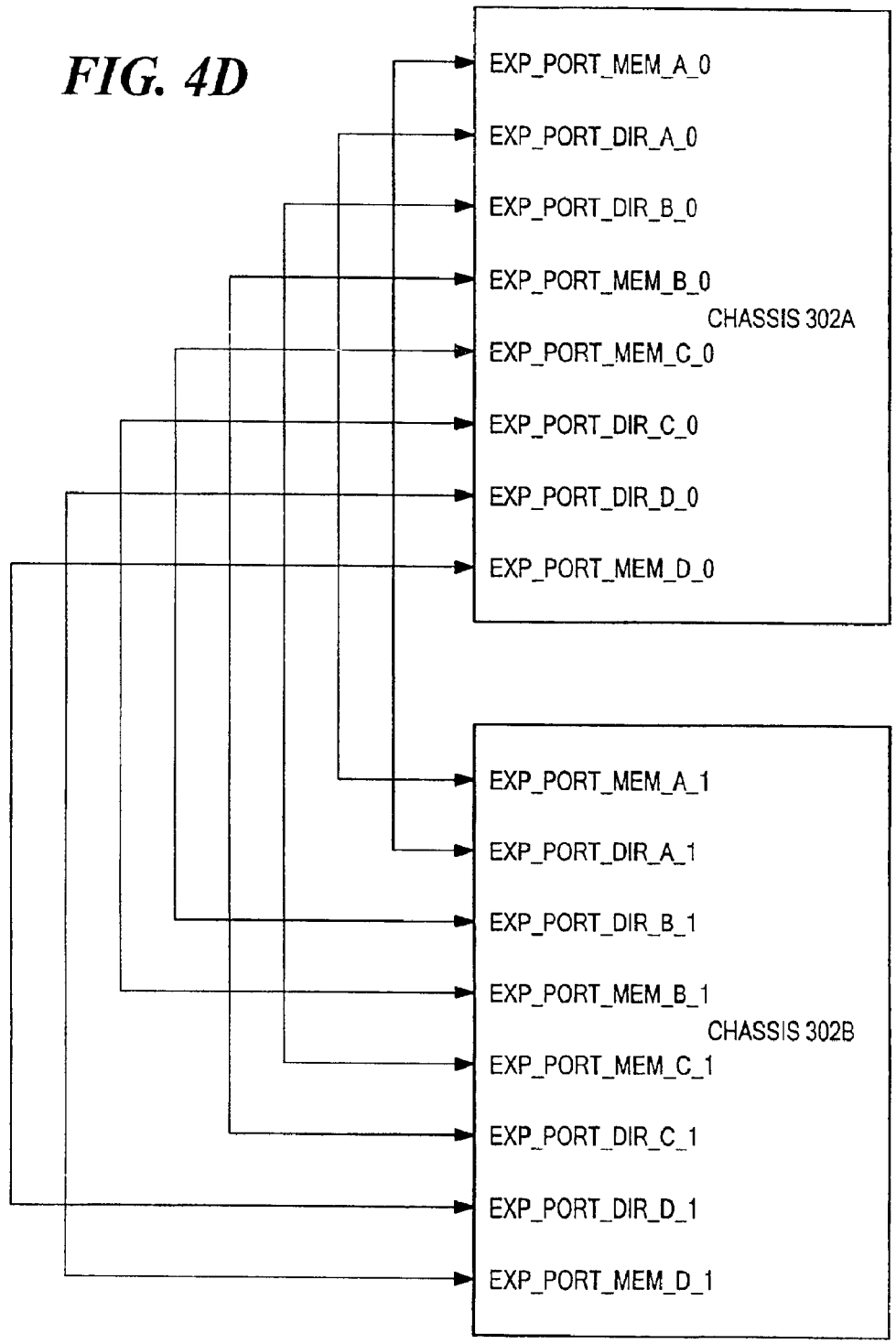
FIG. 4D is a pair of interconnected chassis in FIG. 4C electrically interconnected to provide a data storage system in accordance with the invention.
Figure 4E:
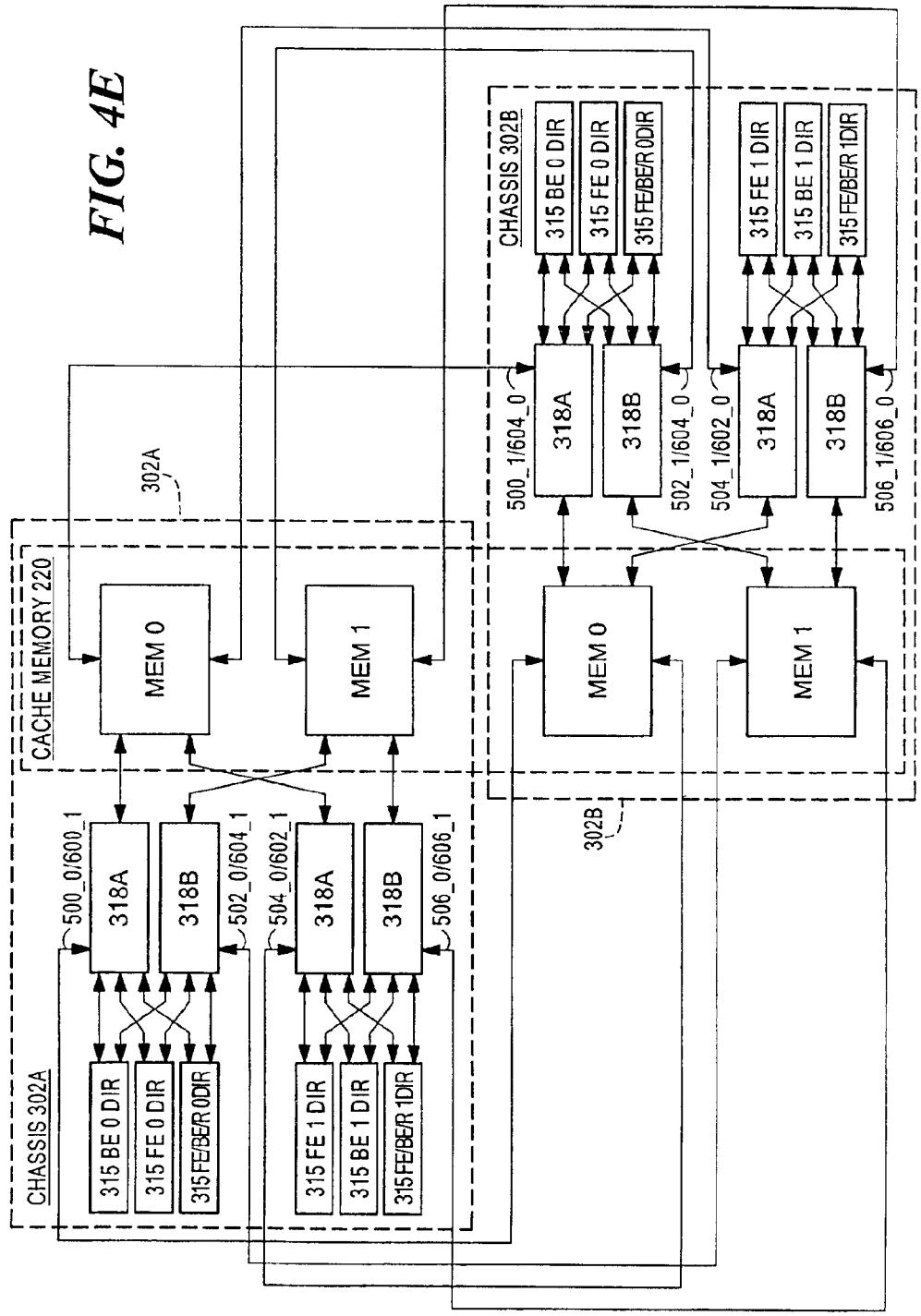
FIG. 4E is the pair of electrically interconnected chassis in FIG. 4D in more detail to provide a data storage system in accordance with the invention.

Referring to FIGS. 4C and 4D, the connections between the pair of chassis 302A and 302B is shown. Thus:

EXP_PORT_MEM_A_0 is connected to EXP_PORT_DIR_A_1

EXP_PORT_MEM_B_0 is connected to EXP_PORT_DIR_C_1

EXP_PORT_MEM_C_0 is connected to EXP_PORT_DIR_B_1

EXP_PORT_MEM_D_0 is connected to EXP_PORT_DIR_D_1

EXP_PORT_MEM_A_1 is connected to EXP_PORT_DIR_A_0

EXP_PORT_MEM_B_1 is connected to EXP_PORT_DIR_C_0

EXP_PORT_MEM_C_1 is connected to EXP_PORT_DIR_B_0 and

EXP_PORT_MEM_D_1 is connected to EXP_PORT_DIR_D_0 such connections being by the cables designated above and in FIGS. 4C and 4D externally of the chassis 302A and 302B.

It follows that the system can be expanded further by adding additional ports to the switches 318A and 318B.

In another embodiment, these ports EXP_PORT_MEM, EXP_PORT_DIR can be connected to an external switching network, not shown, disposed in another rack mountable chassis. This switching network, not shown, can provide many more ports and virtually unlimited capability.

It is noted from FIG. 4F that each one of the directors has a point-to-point data path between itself and each of the four memory boards in the cache memory 220, as described above in connection with FIG. 2.

Figure 5:
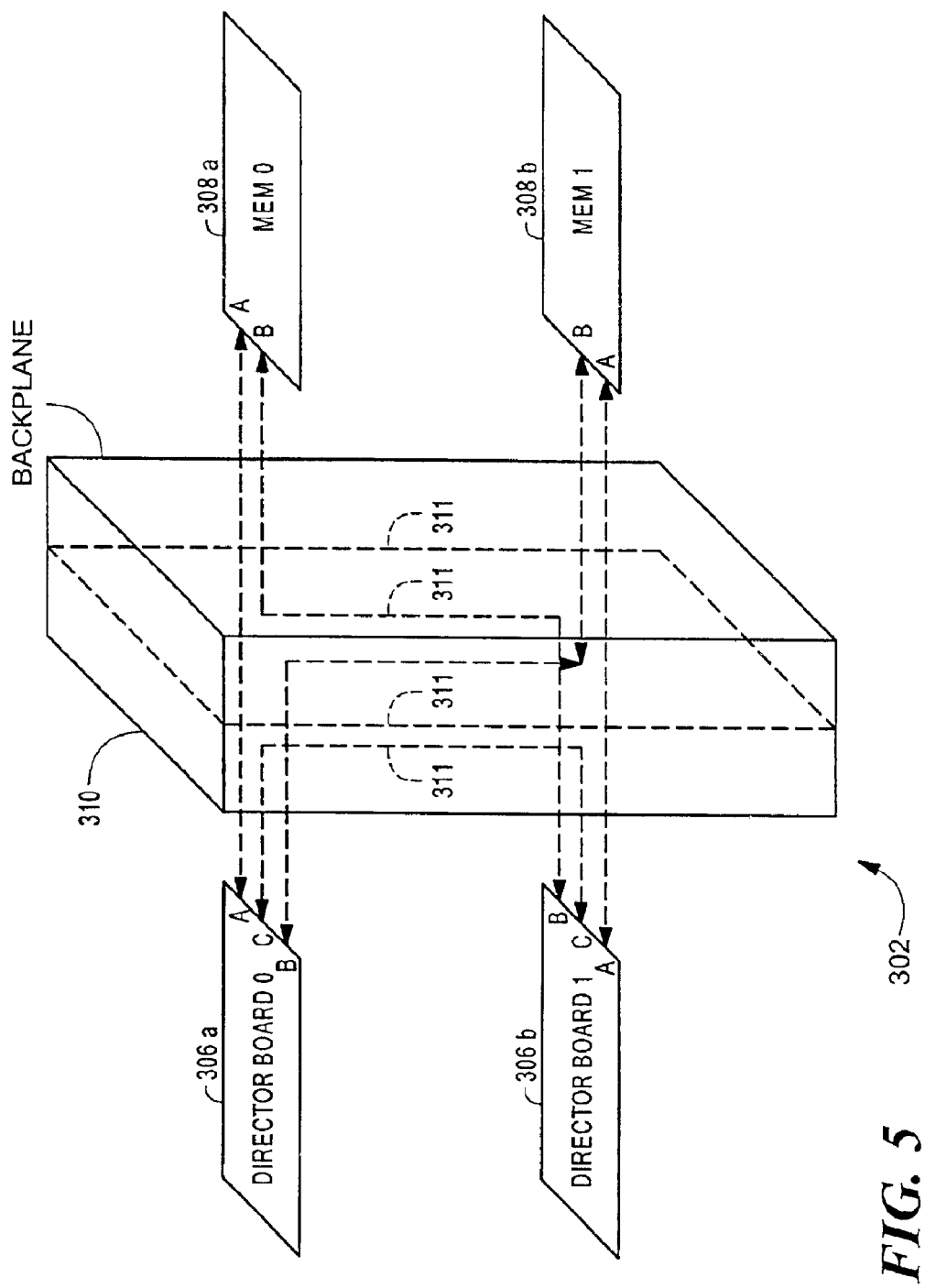
FIG. 5 is shows the electrical interconnections provided by the backplane for the printed circuit boards of FIG. 4.
Figure 6A:
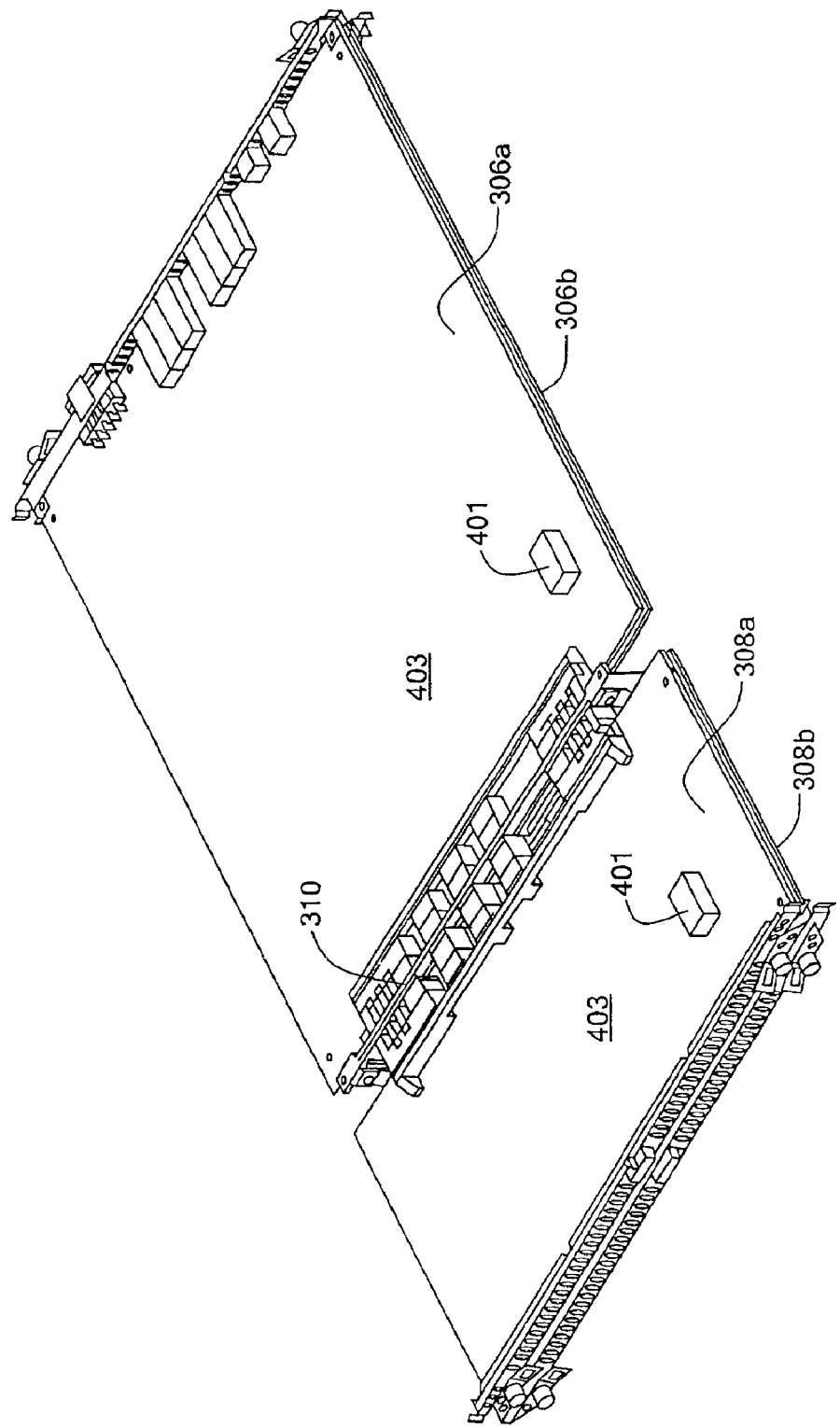
FIGS. 6A–6D show interior portions of the chassis of FIG. 4 having therein a pair of director boards, a pair of memory boards and a backplane to electrically interconnect such memory and director boards to provide a portion of the data system of FIG. 2, FIG. 6A being a front perspective view, FIG. 6B being a rear perspective view, FIG. 6C being a front perspective view with an upper director board and an upper memory board removed.
Figure 6B:
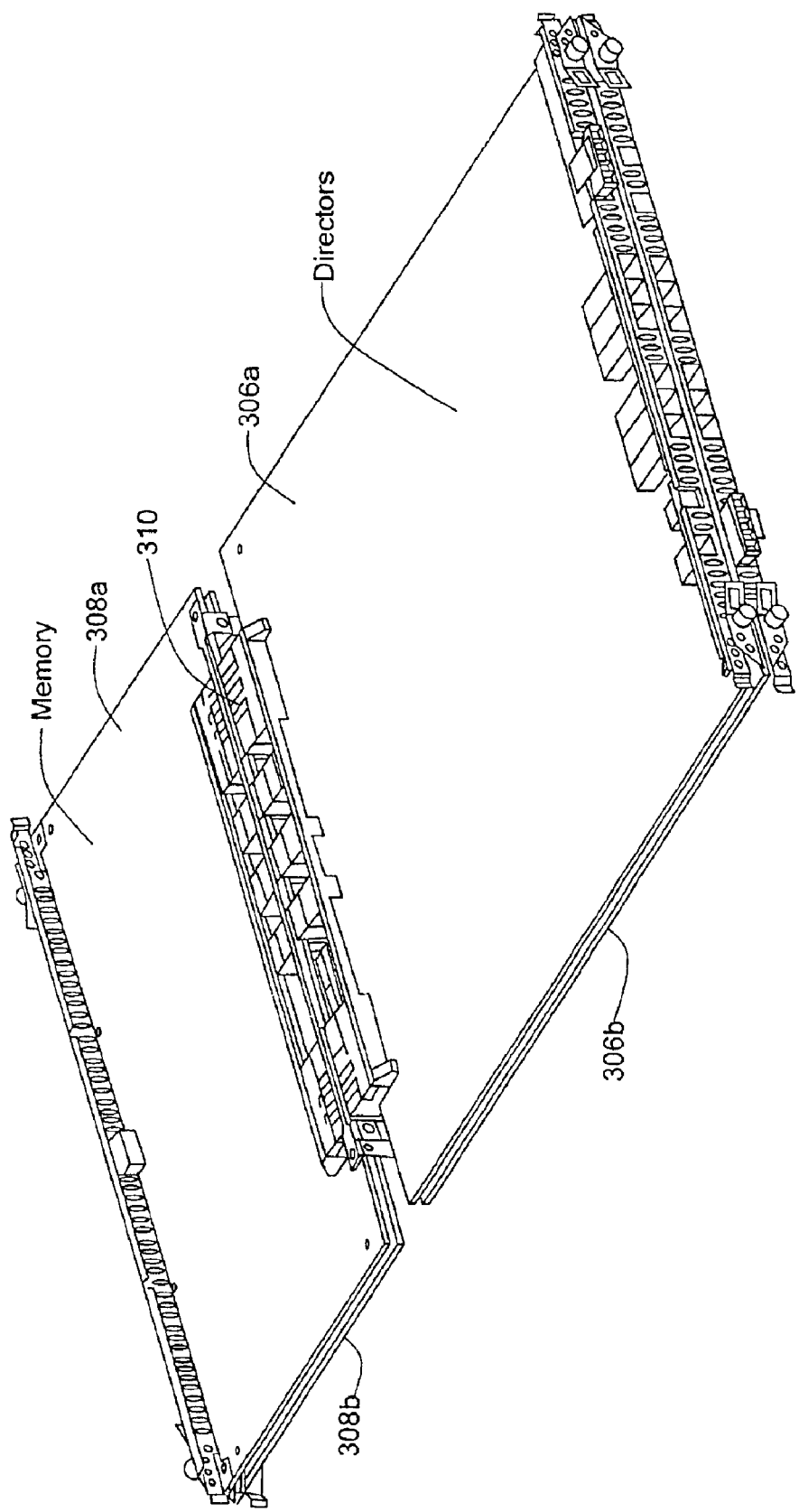
Figure 6C:
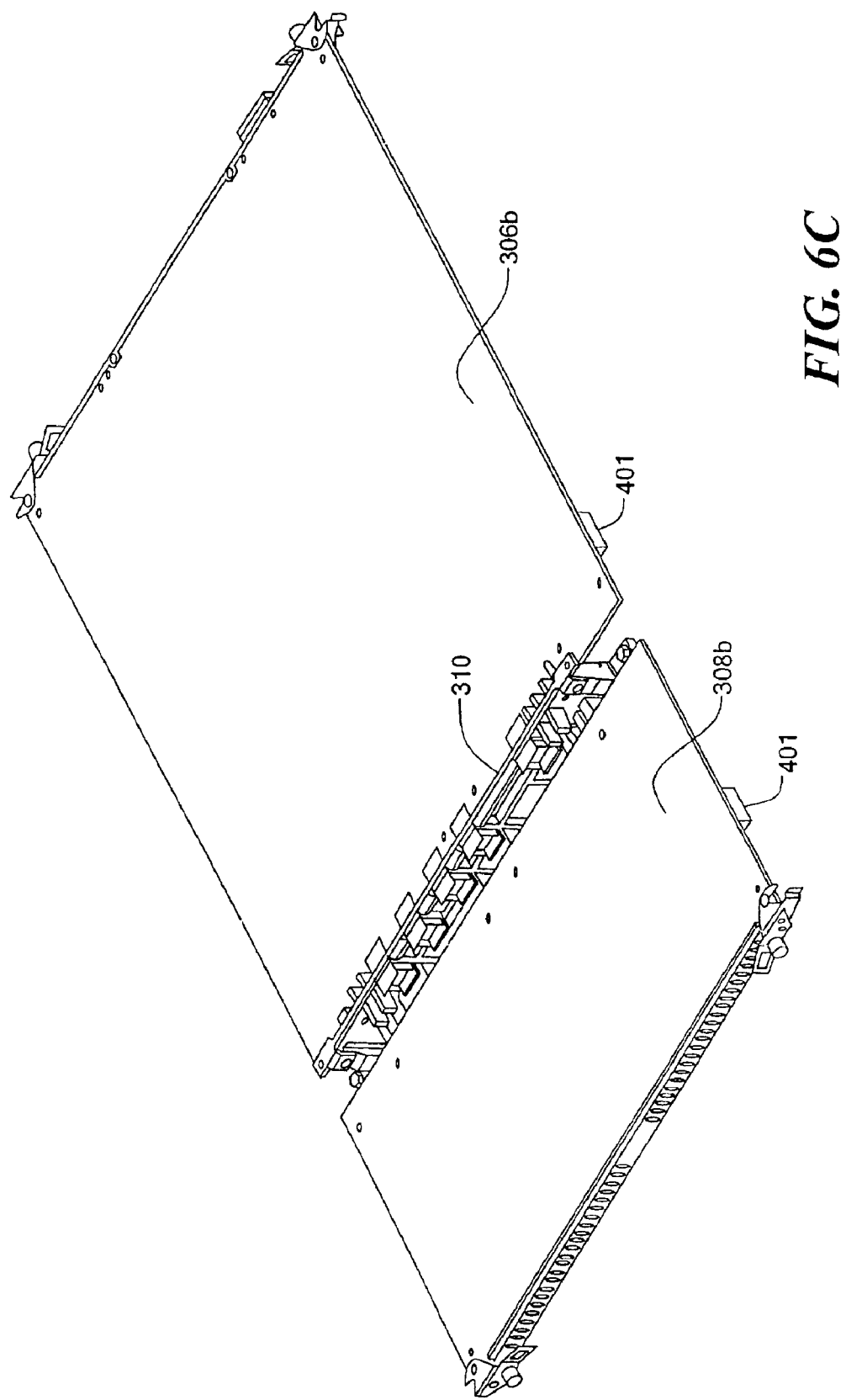
Figure 6D:
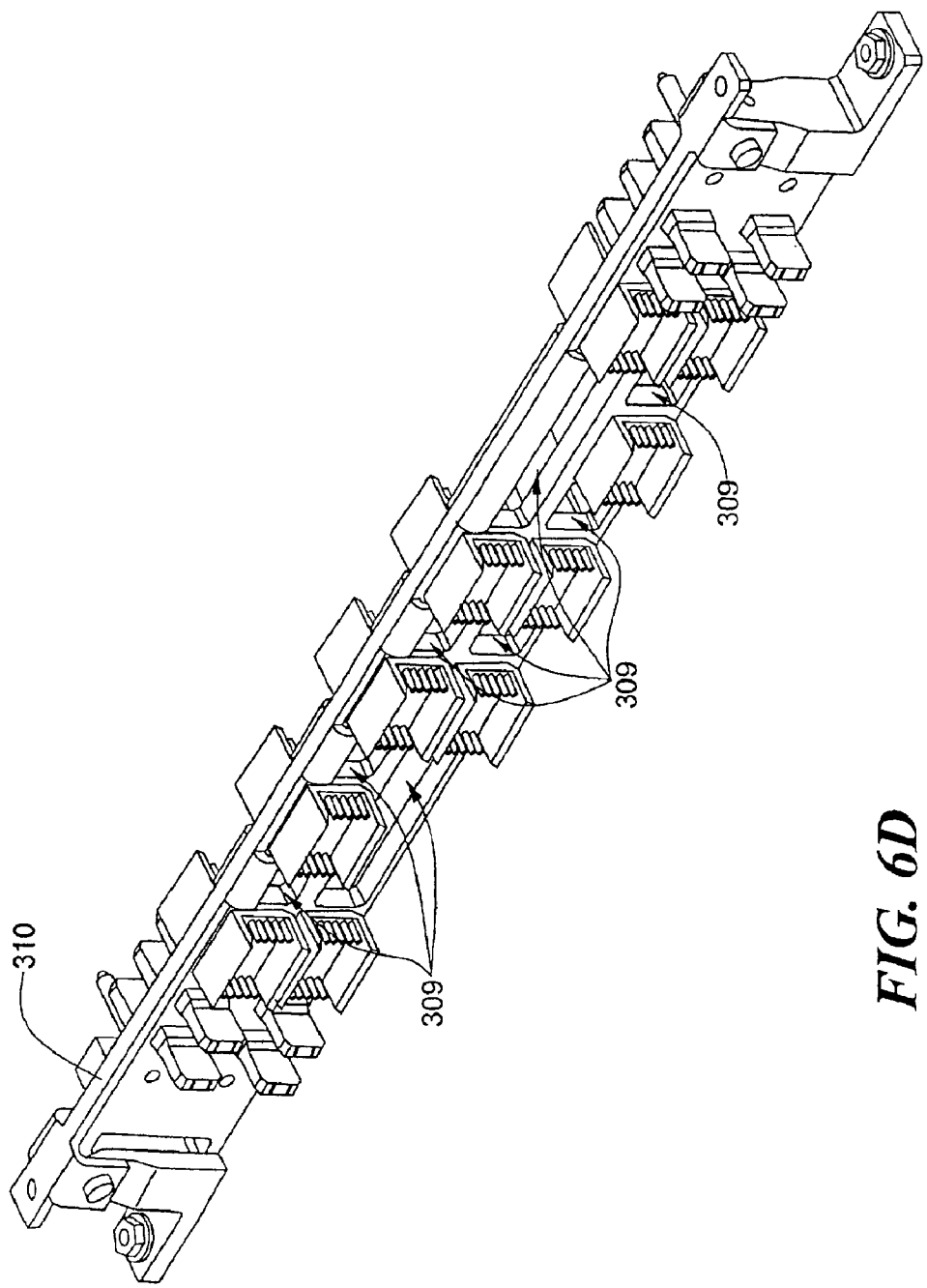

Referring to FIG. 5, the overlaying relationship of director boards 306a and 306b is shown. Further, as noted above, the boards 306a and 306 b are identical in layout and with one of the boards being back-to-back with respect to the other. Thus, the Ports A, B and C of one director board are not vertically aligned with the ports A, B and C, respectively, of the other one of the director boards. Likewise, for the pair of memory boards 308a, 308b. Thus, the Ports A and B of memory board 308a are not vertically aligned with the Ports A and B, respectively, of board 308b. As a result, the four printed circuit boards 306a, 306b, 308a and 308b are electrically interconnected in the backplane printed circuit board 310 with only vertical, or substantially vertical, electrical interconnects 311, is shown.

Further detail of the printed circuit boards 306a, 306b, 308a and 308b and the backplane 310 are shown in FIGS. 6A–6D with a portion of the electrical components 401 30 (FIGS. 6A and 6C) being shown of surfaces of the boards which face outwardly from the interior region of the chassis. 1t is also noted that the backplane 310 (FIG. 6D) is disposed perpendicular to the component 401 mounting surface 403 of the boards 306a, 306b, 308a and 308b (FIG. 6A). 1t is further noted that the backplane has apertures 309 passing therethough along a direction parallel to the component 401 mounting surface 403. Thus, air can flow along over the components and through the apertures 309 and hence through the entire chassis. This configuration also aids in the cooling of the components 410. The interior of the chassis is containing these components is cooled by fans, not shown, mounted to the front end of the chassis.

Figure 7:
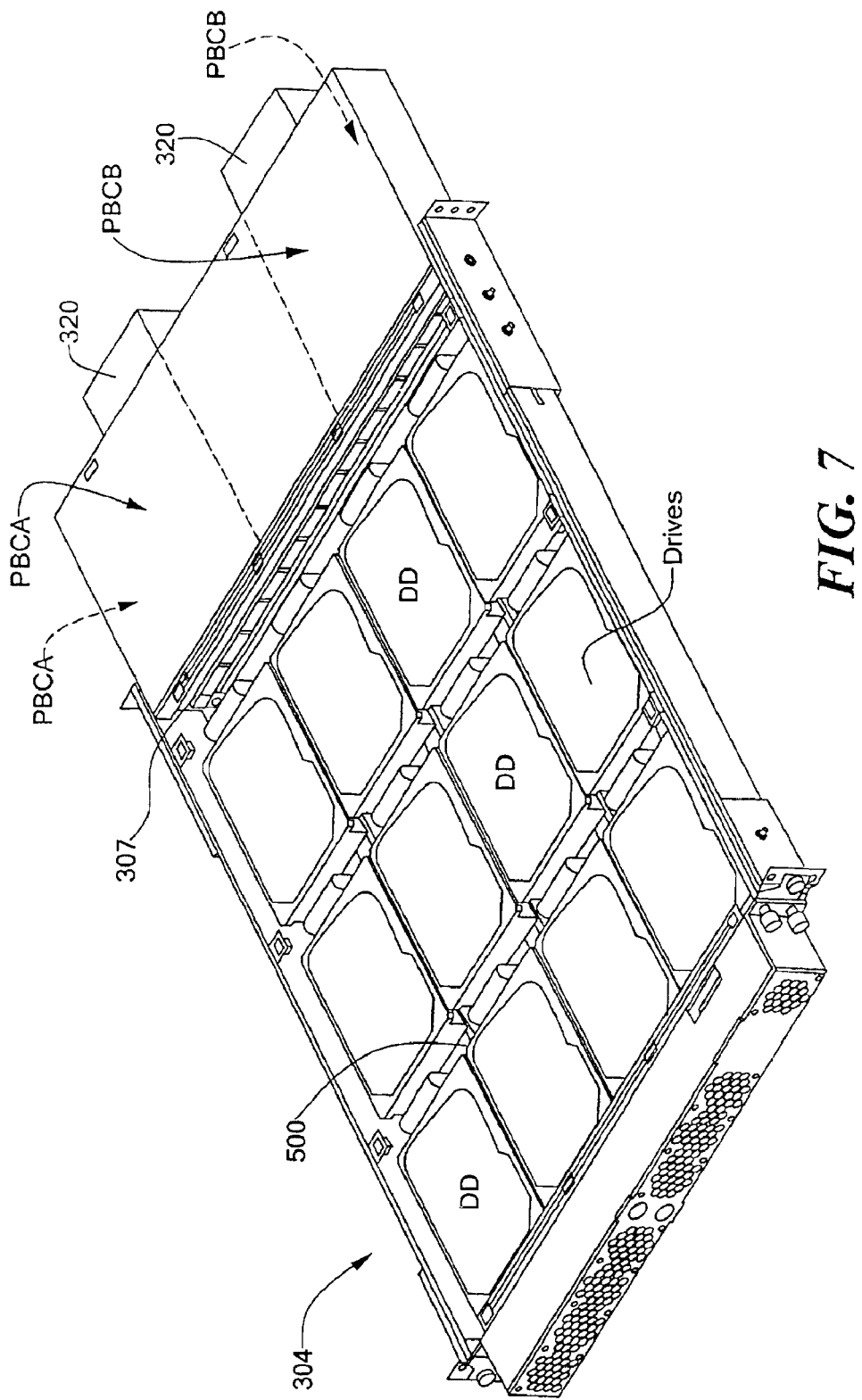
FIG. 7 is a front perspective view of the other one of the chassis in FIGS. 3A and 3B, such chassis having therein an array of disk drives disposed on and electrically connected to a printed circuit boards therein, a pair of port by-pass cards (PBCs) and a backplane to electrically interconnect such disk drives and PBCs to provide another portion of the data system of FIG. 2, the cover of such chassis over the array of disk drives being removed.
Figure 8:
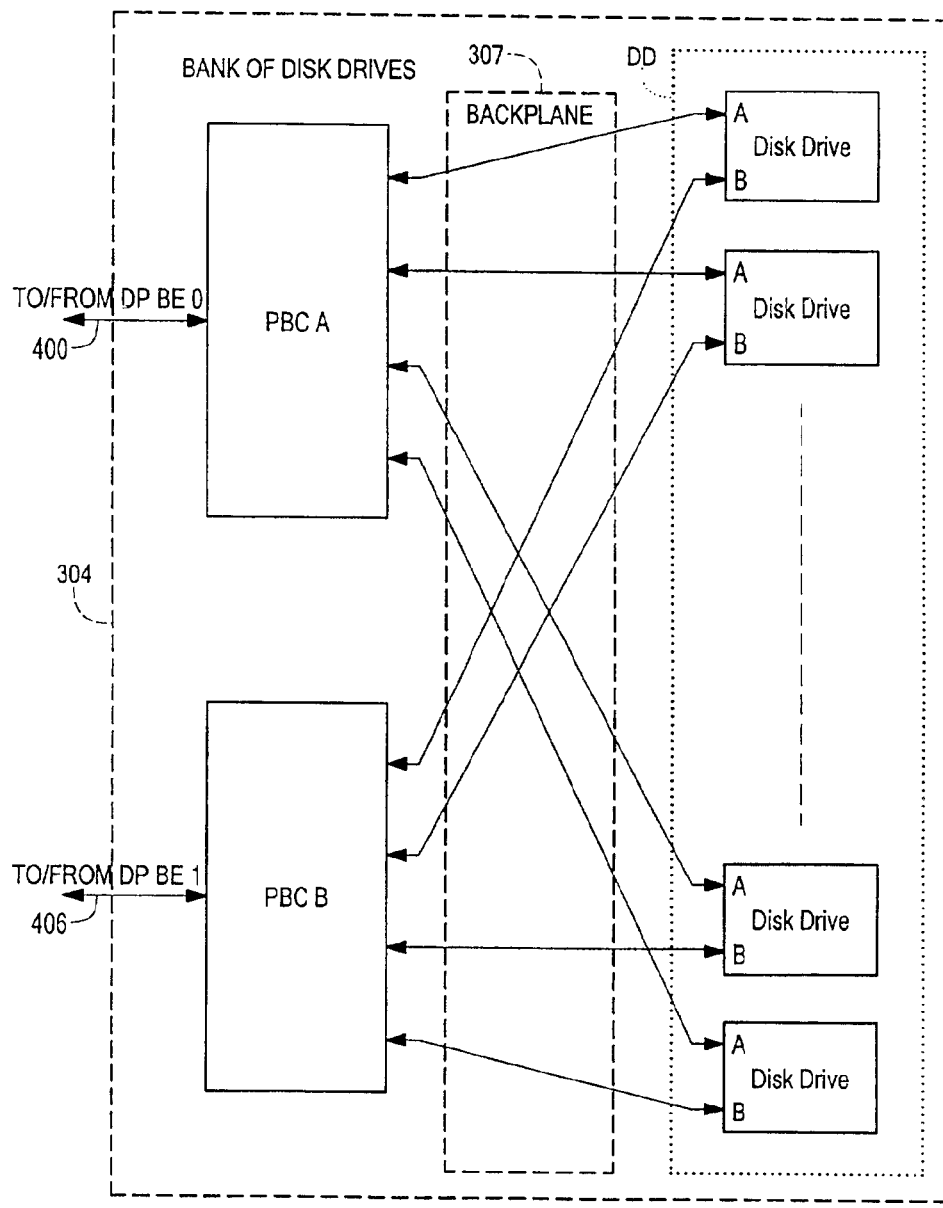
FIG. 8 is other one of the chassis of FIG. 7, such chassis having therein an array of disk drives disposed on and electrically connected to a printed circuit boards therein, a pair of port by-pass cards (PBCs) and a backplane to electrically interconnect such disk drives and PBCs to provide another portion of the data system of FIG. 2.

Disposed in the other one of the chassis 305 (FIG. 7) is a printed circuit board 500 having: an array of rows and columns of disk drives DD, here a 3×4 array, disposed over, and plugged into, an upper, planar surface thereof with ribbon connectors; the backplane, 307 and the pair of PBC units, PBC A and PBC B. The PCB units PBC A and PBC B are electrically interconnected to the array of disk drives DD through the backplane 307. The electrical interconnections are shown in FIG. 8. Thus, the PBC unit PBC A is connected to the A ports of the disk drives and to the back end data pipe 361BE0 via cables external to the cabinets 302, 304. The PBC unit PBC B is connected to the B ports of the disk drives and to the back end data pipe 361BE1 via cables external to the cabinet 302. The interior of the chassis 304 is cooled by fans 320 (FIG. 7) mounted to the front of chassis 302. An identical second fan assembly, not shown, is mounted to cool chassis 302, as noted above.

Referring to FIG, 3A, the director boards 306a, 306b have plugs 322 disposed externally of the chassis 302. The PBC units PBC A and PBC B also have plugs 324 disposed externally of the chassis 304. These plugs allow the PBC units PBC A and PBC B to electrically interconnect to the director boards 306a, 306b via cables 400, 406 (FIG. 4) and enable the director boards 306a, 306b to electrically interconnect with the host computer 120 (FIG. 1) via cables 402 and 404 (FIG. 4).

Figure 9:
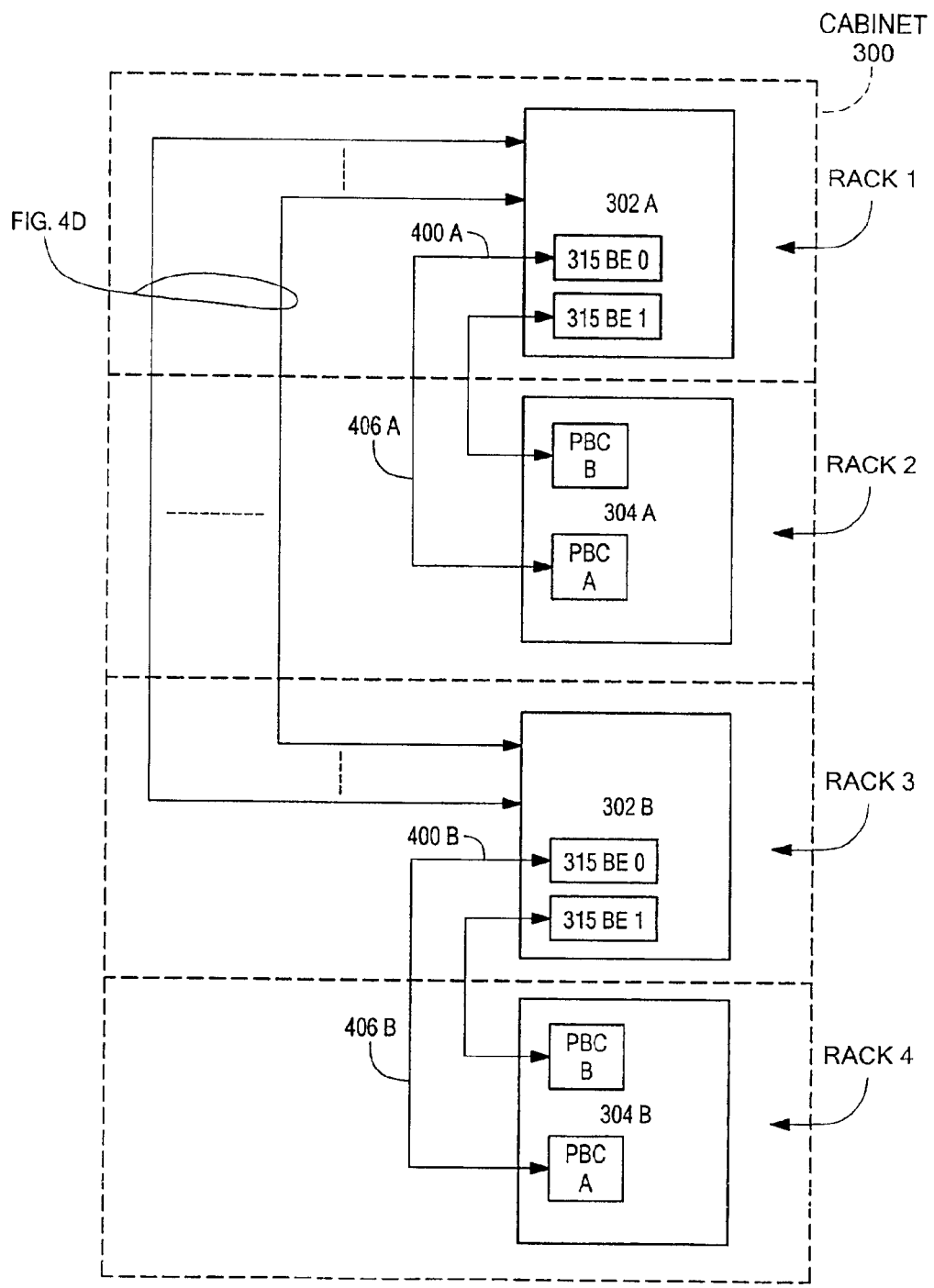
FIG. 9 is a sketch of a cabinet having a plurality of rack mountable chassis therein electrically interconnected to provide a data storage system interface in accordance with the invention.

Referring now to FIG. 9, the cabinet 300 is shown to have a plurality of, here four racks, rack 1, rack 2, rack 3 and rack 4. Disposed in racks 1 and 2 is the pair of electrically interconnected rack mountable chassis 302A and 302B, respectively, described above in connection with FIG. 4D. Here a pair of the chassis 304 shown and described in connection with FIG. 8 are shown, each one being identical to the chassis 304 shown and described in connection with FIG. 8, here one is designated as 304A and the other 304B. Thus, the PBC A and PBC B in rack mountable chassis 304 A are connected to the back end directors 315BE0 and 315BE1, respectively, of chassis 302A, as shown. Likewise, the PBC A and PBC B in rack mountable chassis 404 B are connected to the back end directors 315BE0 and 315BE1, respectively in chassis 302 B, as shown.

A number of embodiments of the invention have been described. Nevertheless, it will be understood that various modifications may be made without departing from the spirit and scope of the invention. Accordingly, other embodiments are within the scope of the following claims.

What is claimed is:

1. A cabinet, comprising:

a plurality of rack mountable chassis,
  (A) a first one of such chassis having:
    (i) a memory disposed on a first memory printed circuit board;
    (ii) a plurality of directors;
      (a) a first portion of the plurality of the directors being disposed on a first director printed circuit board;
      (b) a second portion of the directors being disposed on a second director printed circuit board;
    (iii) a backplane, the first director printed circuit board and the second director printed circuit board being disposed in a back-to-back overlaying relationship, one end of the first director printed circuit board and one end of the second director printed circuit board being plugged into one side of the backplane, the first memory printed circuit board being plugged into an opposite side of the backplane;
  (B) a second one of such chassis having a plurality of disk drives;
  (C) first electrical conductors for connecting the disk drives in the second chassis to a portion of the directors in the first one of the chassis;
  (D) a third one of such chassis having:
    (i) a memory disposed on a second memory printed circuit board;
    (ii) a plurality of directors;
      (a) a first portion of the plurality of the directors being disposed on a third director printed circuit board;
      (b) a second portion of the plurality of the directors being disposed on a fourth printed circuit board;
    (iii) a second backplane, the third director printed circuit board and the fourth director printed circuit board being disposed in a back-to-back overlaying relationship, one end of the third director printed circuit board and one end of the fourth director printed circuit board being plugged into one side of the second backplane, the second memory printed circuit board being plugged into an opposite side of the second backplane;
  (E) a fourth one of such chassis having a plurality of disk drives;
  (F) second electrical conductors for connecting the disk drives in the fourth one of the chassis to a portion of the plurality of directors in the third one of the chassis; and
  (G) third electrical connectors for electrically the memory in the first one of the chassis and the memory in the third one of such chassis.

2. A cabinet, comprising:

a rack mountable chassis, such chassis having:

a backplane;

a first printed circuit board plugged into a first side of the backplane;

a second printed circuit board plugged into the first side of the backplane, such first and second printed circuit boards being disposed in an overlaying relationship;

a third printed circuit board plugged into a second side of the backplane, such second side being opposite to the first side;

a memory having at least a first portion thereof disposed on the third printed circuit board;

a plurality of directors for controlling data transfer between a host computer/server and a bank of disk drives as such data passes through the memory;

a first plurality of the directors being coupled to the host computer/server, a first portion of such first plurality of directors being disposed on the first printed circuit boards and a second portion of the first plurality of directors being disposed on the second printed circuit board;

a second plurality of the directors being coupled to the bank of disk drives, a first portion of such second plurality of directors being disposed on the first printed circuit boards and a second portion of the second plurality of the directors being disposed on the second printed circuit board;

a first switch network disposed on the first printed circuit board, such first switch network having ports coupled to: the first portion of the first plurality of directors; the first portion of the second plurality of directors; and, a first port of the memory through the backplane;

a second switch network disposed on the second printed circuit board, such second switch network having ports coupled to: the second portion of the first plurality of directors; the second portion of the second plurality of directors; and, a second port of the memory through the backplane.

3. The cabinet recited in claim 2, wherein the chassis includes:

a fourth printed circuit board plugged into a second side of the backplane, such second side being opposite to the first side, such third and fourth printed circuit boards being disposed in an overlaying relationship;

wherein a second portion of the memory is disposed on the fourth printed circuit board;

wherein the first switch network has ports coupled to: the first portion of the first plurality of directors; the first portion of the second plurality of directors; and, a first port of the second portion of the memory through the backplane;

wherein the second switch network has ports coupled to: the second portion of the first plurality of directors; the second portion of the second plurality of directors; and, a second port of the second portion of the memory through the backplane.

4. The cabinet recited in claim 3 including a second chassis, such second chassis having disposed therein:

a fifth printed circuit board having disposed thereon the bank of disk drives, such disk drives being disposed an a matrix of rows and columns;

a second backplane having electrically connected to one side thereof the bank of disk drives;

a pair of redundant port by-pass units plugged into an opposite side of the second backplane, each one of the disk drives having a pair of redundant ports, a first one of such redundant ports being electrically connected to a first one of the pair of redundant port by-pass units through the second backplane and a second one of such redundant ports being electrically connected to a second one of the pair of redundant port by-pass units through the second backplane and wherein a first one of the pair of redundant port by-pass units is connected to the back end directors.

5. The cabinet recited in claim 3 including a second chassis having disposed therein the fourth printed circuit board with the bank of disk drives plugged into the second backplane, and the pair of redundant port by-pass units.

6. The cabinet recited in claim 2 including a second chassis, such second chassis having disposed therein:

a fourth printed circuit board having disposed thereon the bank of disk drives, such disk drives being disposed an a matrix of rows and columns;

a second backplane having electrically connected to one side thereof the bank of disk drives;

a pair of redundant port by-pass units plugged into an opposite side of the second backplane, each one of the disk drives having a pair of redundant ports, a first one of such redundant ports being electrically connected to a first one of the pair of redundant port by-pass units through the second backplane and a second one of such redundant ports being electrically connected to a second one of the pair of redundant port by-pass units through the second backplane and wherein a first one of the pair of redundant port by-pass units is connected to the back end directors.

7. The cabinet recited in claim 6 including a second chassis having disposed therein the fourth printed circuit board with the bank of disk drives plugged into the second backplane, and the pair of redundant port by-pass units.

8. The recited in claim 2 wherein the first director printed circuit board and the second director printed circuit board are disposed in a back-to-back overlying relationship.

9. The cabinet recited in claim 2 wherein each one of the plurality of first rack mountable chassis includes a pair of said memory boards disposed in an overlaying relationship and are both plugged into said opposite side of the memory board of such one of the plurality of first rack mountable chassis.

10. The cabinet recited in claim 9 wherein the memory broards are disposed in a back-to-back overlying relationship.

* * * * *